(12) United States Patent
Williams et al.

(10) Patent No.: US 8,063,318 B2
(45) Date of Patent: Nov. 22, 2011

(54) ELECTRONIC COMPONENT WITH WIRE BONDS IN LOW MODULUS FILL ENCAPSULANT

(75) Inventors: Susan Williams, Balmain (AU); Laval Chung-Long-Shan, Balmain (AU); Kiangkai Tankongchumruskul, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 438 days.

(21) Appl. No.: 12/364,514

(22) Filed: Feb. 3, 2009

(65) Prior Publication Data

US 2009/0135569 A1 May 28, 2009

Related U.S. Application Data

(63) Continuation-in-part of application No. 12/237,387, filed on Sep. 25, 2008, now abandoned, which is a continuation-in-part of application No. 11/860,539, filed on Sep. 25, 2007.

(51) Int. Cl.
*H01L 23/28* (2006.01)

(52) U.S. Cl. ........ 174/523; 174/521; 257/782; 257/788; 257/793

(58) Field of Classification Search ................. 174/521, 174/523; 257/782, 788, 793
See application file for complete search history.

(56) References Cited

U.S. PATENT DOCUMENTS

| | | | |
|---|---|---|---|
| 4,595,938 A | 6/1986 | Conta et al. | |
| 4,933,744 A * | 6/1990 | Segawa et al. | 257/795 |
| 5,008,736 A | 4/1991 | Davies et al. | |
| 5,468,999 A | 11/1995 | Lin et al. | |
| 5,577,319 A | 11/1996 | Knecht | |
| 5,771,157 A * | 6/1998 | Zak | 361/760 |
| 5,863,488 A | 1/1999 | Moriya | |
| 6,022,583 A | 2/2000 | Falcone et al. | |
| 6,071,427 A | 6/2000 | Raulinaitis | |
| 6,081,997 A | 7/2000 | Chia et al. | |
| 6,097,100 A * | 8/2000 | Eguchi et al. | 257/787 |
| 6,143,588 A | 11/2000 | Glenn | |
| 6,166,433 A * | 12/2000 | Takashima et al. | 257/702 |
| 6,291,884 B1 | 9/2001 | Glenn et al. | |
| 6,326,240 B1 | 12/2001 | Liaw | |
| 6,414,849 B1 | 7/2002 | Chiu | |
| 6,644,782 B1 | 11/2003 | Ward et al. | |
| 6,672,710 B1 | 1/2004 | Silverbrook et al. | |
| 6,709,893 B2 * | 3/2004 | Moden et al. | 438/113 |
| 6,790,473 B2 | 9/2004 | Papathomas et al. | |
| 6,805,541 B1 | 10/2004 | Hashimoto | |
| 6,836,962 B2 | 1/2005 | Khandros et al. | |
| 6,844,632 B2 * | 1/2005 | Shiono et al. | 257/788 |
| 6,885,093 B2 | 4/2005 | Lo et al. | |

(Continued)

FOREIGN PATENT DOCUMENTS

WO WO 03/006230 A1 1/2003

*Primary Examiner* — Hung Ngo

(57) ABSTRACT

An electronic component that has a support structure with a plurality of electrical conductors, a series of wire bonds, each of the wire bonds extending from one of the electrical conductors respectively, each of the wire bonds having an end section contacting the electrical conductor and an intermediate section contiguous with the end section, a bead of dam encapsulant encapsulating the electrical conductors and the end section of each of the wire bonds, and a bead of fill encapsulant contacting the bead of dam encapsulant and encapsulating the intermediate portion of each of the wire bonds. The dam encapsulant has a higher modulus of elasticity than the fill encapsulant.

18 Claims, 14 Drawing Sheets

U.S. PATENT DOCUMENTS

| | | |
|---|---|---|
| 6,888,259 B2 * | 5/2005 | Ishikawa et al. ............... 257/788 |
| 7,005,009 B2 | 2/2006 | Aoki et al. |
| 7,268,436 B2 * | 9/2007 | Aigner et al. ................. 257/777 |
| 7,928,587 B2 * | 4/2011 | Tamba et al. ................. 257/784 |
| 2001/0014486 A1 | 8/2001 | Glenn |
| 2002/0089069 A1 * | 7/2002 | Lamson et al. ............... 257/784 |
| 2002/0127776 A1 * | 9/2002 | Nakajo et al. ................. 438/110 |
| 2002/0166687 A1 * | 11/2002 | Tornovist et al. ............ 174/52.2 |
| 2002/0185752 A1 * | 12/2002 | Ishikawa et al. ............. 257/788 |
| 2003/0146464 A1 | 8/2003 | Prophet |
| 2003/0160311 A1 | 8/2003 | Ismail et al. |
| 2004/0100532 A1 | 5/2004 | Silverbrook |
| 2004/0241906 A1 | 12/2004 | Chan |
| 2005/0200669 A1 | 9/2005 | Timm et al. |
| 2005/0242159 A1 | 11/2005 | Yajima |
| 2007/0045872 A1 | 3/2007 | Fee |
| 2007/0105280 A1 | 5/2007 | Li |
| 2008/0099895 A1 | 5/2008 | Kwak |
| 2008/0158298 A1 | 7/2008 | Serbicki et al. |
| 2008/0164618 A1 | 7/2008 | Chow et al. |
| 2008/0237887 A1 | 10/2008 | Takiar et al. |
| 2008/0295332 A1 | 12/2008 | Shimazu et al. |
| 2009/0032926 A1 | 2/2009 | Sharifi |

* cited by examiner

ELECTRONIC COMPONENT WITH WIRE BONDS IN LOW MODULUS FILL ENCAPSULANT

CROSS REFERENCE TO RELATED APPLICATIONS

The present application is a Continuation-In-Part of U.S. Ser. No. 12/237,387, filed Sep. 25, 2008, which is a Continuation-In-Part of U.S. Ser. No. 11/860,539, filed Sep. 25, 2007, the contents of which are incorporated herein by cross reference.

FIELD OF THE INVENTION

The invention relates to the field of integrated circuit packaging. In particular, the encapsulation of the wire bonds between a circuit board and the contact pads on the integrated circuit die.

BACKGROUND OF THE INVENTION

Integrated circuits fabricated on silicon wafer substrates are electrically connected to printed circuit boards by wire bonds. The wire bonds are very thin wires—around 25 to 40 microns in diameter—extending from contact pads along the side of the wafer substrate to contacts on the printed circuit board (PCB). To protect and strengthen the wire bonds, they are sealed within a bead of epoxy called encapsulant. The wires from the contact pads to the PCB are made longer than necessary to accommodate changes in the gap between the PCB and the contact pads because of thermal expansion, flex in the components and so on. These longer than necessary wires naturally form an arc between the contact pads and the PCB. The top of the wire arc is often about 300 microns above the contact pads although some wire bonding may extend even higher. As the name suggests, the encapsulant needs to encapsulate the full length of the wire so the encapsulant bead will extend 500 microns to 600 microns proud of the contact pads.

The integrated circuit fabricated on the silicon wafer is often referred to as a 'die'. For the purposes of this specification, the term die will be used as a reference to an integrated circuit fabricated on a wafer substrate using the well known etching and deposition techniques commonly used in semiconductor fabrication. If the die is purely an electronic microprocessor, there is little need to keep close control of the encapsulant bead dimensions. However, if the die is a microelectro mechanical systems (MEMS) device with an active upper surface, it may be necessary or desirable to bring the active surface of the die onto close proximity with another surface. One such situation applies to inkjet printheads. The proximity of the print media to the nozzle array influences the print quality. Similarly, if a cleaning surface is wiped across the nozzles, the bead of encapsulant can hamper the wiping contact.

Wirebonders are automated devices that weld small lengths of wire from conductors on the PCB to the contact pads on an integrated circuit die. Wire is fed through a bonding tool that uses some combination of pressure, heat and/or ultra-sonic energy to attach the wire to the bond pads via a solid phase welding process. The two most common types of wire bonder are referred to as wedge bond and ball bond. These refer to the bonding tool and the configuration of the wire bond itself. With both types of wirebonders, the individual wire bonds extend in an arc from the bond pad on the integrated circuit (IC) die to the conductor on the PCB. This is because wires from the contact pads to the PCB are made longer than necessary to accommodate changes in the gap between the PCB and the bonds pads due to thermal expansion, flex in the components and so on.

Wedge bonders have the advantage of a lower loop height. Ball bonders weld a ball of metal to a contact with the wire extending away from the ball at right angles to the contact surface. In contrast, the wedge bonder presses the side of the wire against the contact and so incident angle of the wire to the plane of the contact is lower. Hence the loop height is also lower. However, there is a weak spot at the transition point between the wire welded to the contact and the wire extending away from the contact at an angle. This point is often referred to as the heel of the wire bond and is significantly strain hardened from bending and the ultra-sonic welding process. The metal becomes brittle and less resistant to crack propagation. The localized deformation caused by the wedge is a stress concentration that provides a crack initiation site and fatigue failure occurs quickly with thermal cycling.

The bead of encapsulant reinforces the wire but the difference in thermal expansion between the wire and the underlying support is still sufficient to cause bending at the heel and ultimately fatigue failure.

Accurately depositing the bead of encapsulant on the bond pads is problematic. One commonly used technique for depositing the encapsulant involves extruding it from a needle directly onto the line of wire bonds. The encapsulant volume and placement on the die is not very accurate. Variations in the pressure from the pump or slight non-uniformities in the speed of the needle cause the side of the bead contacting the active surface to be reasonably crooked. As the side of the bead is not straight, it has to be generously spaced from any active parts on the active surface to comfortably accommodate the perturbations. Spacing the electrical contacts away from the active portions (say for example, inkjet nozzles) of the active surface uses up valuable wafer real estate and reduces the number of dies that can be fabricated from a wafer disc.

"Jetting" is another common encapsulant deposition technique. A nozzle ejects relatively large drops (10 to 50 picoliters) of epoxy encapsulant directly onto the wire bonds. This is a more precise method of deposition in terms of dimensional accuracy. However, jetting encapsulant down onto the wire bonds can produce bubbles of trapped air inside the bead. When the epoxy is cured, the heat increases the pressure in the bubbles and cause cracks in the epoxy. This can break or expose the wires which then fail prematurely.

The air bubbles are prone to form when the surface beneath the wire bonds has a complicated topography. For example, deep trenches or stepped formations can present shapes and geometries that do not completely fill with the uncured epoxy as it is flows over the wire bonds and into the underlying surface. In surface geometries with a section that is narrower than the meniscus curvature of the uncured epoxy, the epoxy flow pins at the narrow section and fails to wet the entire underlying surface thereby trapping an air bubble.

Another problem associated with jetting encapsulant is the generation of satellite drops that break off from the main drops of encapsulant. The satellite drops are several orders of magnitude smaller than the main drops and so susceptible to misdirection from air turbulence. With normal integrated circuit dies, misdirected satellite drops are of little consequence. However, if the die as an active surface such as an inkjet printhead die, the small satellite drops of epoxy can have detrimental effects on the operation of any MEMS structures.

In light of the widespread use of inkjet printheads, the invention will be described with specific reference to its application in this field. However, the ordinary worker will appreciate that this is purely illustrative and the invention is equally applicable to other integrated circuits and micro-device (such as lab-on-a-chip devices) that are wire bonded to a PCB or other support structure.

SUMMARY OF THE INVENTION

According to a first aspect, the present invention provides a micro-electronic device comprising:

a support structure with a plurality of electrical conductors;

a series of wire bonds, each of the wire bonds extending from one of the electrical conductors respectively, each of the wire bonds having an end section contacting the electrical conductor and an intermediate section contiguous with the end section;

a bead of dam encapsulant encapsulating the electrical conductors and the end section of each of the wire bonds;

a bead of fill encapsulant contacting the bead of dam encapsulant and encapsulating the intermediate portion of each of the wire bonds; wherein, the dam encapsulant has a higher modulus of elasticity than the fill encapsulant.

The encapsulant with a higher modulus of elasticity reinforces the ends of the wire bonds at the weld to the conductive traces on a PCB. This section includes the heel of the wire bond which, as discussed above, has the lowest fatigue strength. The lower modulus encapsulant material encases the intermediate sections of each wire bond. The intermediate section of each wire bond is sealed from the elements but the lower modulus accommodates movement in the wires caused by thermal expansion differences (between the PCB and the metal of the wire bonds). This shifts the cyclic loading of the wire bond to a section with greater fatigue strength. In particular, the greatest loading occurs at the interface between the high and low modulus encapsulant.

Preferably, the support structure comprises a printed circuit board (PCB) and the electrical conductors are PCB contacts connected to conductive traces on the PCB. In a further preferred form, the microprocessor device further comprises a die mounted to a chip mounting area on the support structure, the die having a back surface in contact with the chip mounting area and an active surface opposing the back surface, the active surface having electrical contact pads; such that, the wire bonds electrically connect the PCB contacts and the electrical contact pads on the die; wherein, a second bead of dam encapsulant is contiguous with the bead of fill encapsulant and encapsulates the electrical contact pads.

Preferably, the dam encapsulant has an elastic modulus between 1 GPa and 3 GPa when cured and the fill encapsulant has an elastic modulus between 10 MPa and 500 MPa.

In some embodiments, the support structure has a PCB mounting area and the support structure is configured such that the chip mounting area is raised relative to the PCB.

By raising the chip mounting area relative to the rest of the PCB, or at least the conductors connected to the PCB end of the wire bonds, the top of the arc formed by the layer is much closer to the active surface of the die. This, in turn, allows the bead of encapsulant to have a lower profile relative to the active surface. With a lower encapsulant bead, the active surface can be brought into closer proximity with another surface without making contact. For example, the nozzle array on a printhead IC can be 300 microns to 400 microns from the paper path.

Preferably, the chip mounting area is raised more than 100 microns relative to the PCB contacts. Preferably, the support structure has a step between the chip mounting area and the conductor mounting area. In a particularly preferred form, the support structure comprises an adhesive die attach film which provides the chip mounting area.

Preferably, the PCB is a flexible printed circuit board (flex PCB) and the PCB contacts are a line of bond pads along an edge closest to the die, the bond pads being more than 2 mm from the contacts pads on the die.

Preferably, the wire bonds are formed from wire with a diameter less than 40 microns and extend less than 100 microns above the active surface of the die.

Preferably, the intermediate section of each wire bond forms an arc between the PCB contacts and the contact pads on the die, the end section of each of the wire bonds as a curved heel that connects the intermediate section to a foot segment that is welded to the PCB contact, and the second end section having a corresponding heel to connect the intermediate section to a foot segment welded to the contact pads on the die, the curved heel at the PCB contacts having a smaller radius of curvature than the corresponding heel at the contact pads of the die such that the arc of the intermediate section has a peak skewed towards the PCB.

Preferably, the active surface has functional elements spaced less than 260 microns from the contacts pads of the die. In a particularly preferred form, the die is an inkjet printhead IC and the functional elements are nozzles through which ink is ejected. In some embodiments, the support structure is a liquid crystal polymer (LCP) molding.

Preferably, the bead of encapsulant extending less than 200 microns above the active surface of the die.

Preferably, the wire bonds are covered in a bead of encapsulant, the bead of encapsulant having a profiled surface that is flat, parallel to and spaced less than 100 microns from the active surface.

Preferably, the wire bonds are covered in a bead of encapsulant, the bead of encapsulant having a profiled surface that is flat and inclined relative to the active surface.

Preferably, the wire bonds are covered in a bead of encapsulant, the encapsulant being an epoxy material that is thixotropic when uncured.

Preferably, the wire bonds are covered in a bead of encapsulant, the encapsulant being an epoxy material has a viscosity greater than 700 cp when uncured.

In a particular embodiment, the printhead IC is mounted in a printer such that during use the nozzles are less than 100 microns from the paper path.

According to a second aspect, the present invention provides a method of controlling an encapsulant jetter that jets drops of encapsulant, the drops including primary drops and satellite drops that are much smaller than the primary drops, the method comprising the steps of:

providing a series of wire bonds electrically connecting a micro-electronic device to a series of conductors;

jetting the drops of encapsulant from the jetter; and, inducing a gas flow with a velocity sufficient to draw the satellite drops in a predetermined direction away from the series of wire bonds while having negligible effect on the primary drops.

The Applicant has found that a relatively low speed gas flow will draw satellite drops out of the stream of jetted drops and not have any significant effect on the primary drops. Hence, a gas flow away from the die effectively prevents satellite drops from depositing on the active surface while the wire bonds are sealed in encapsulant. As discussed above in the Background of the Invention, the satellite drops can be seriously detrimental to a die with an active surface such as a printhead IC.

Preferably, the gas flow velocity has a speed less than 2 meters per second. In a further preferred form, the gas flow is transverse to an intended drop trajectory extending from the jetter to the wire bonds. Preferably, the primary drops have a mass at least 100 times greater than the satellite drops. In some embodiments, the gas flow is generated by a source of air at pressure higher than atmospheric. Optionally, the gas flow is generated by a source of air at pressure lower than atmospheric.

Optionally, the wire bonds electrically connect a printed circuit board (PCB) to a die. In some preferred forms, the method further comprises the steps of jetting a bead of dam encapsulant on the die and a bead of the dam encapsulant on the PCB and subsequently jets a bead of fill encapsulant between the beads of dam encapsulant on the die and the PCB respectively. Preferably, the velocity of the gas flow used when jetting the dam encapsulant is different to the velocity of the gas flow used when jetting the fill encapsulant.

Preferably, the die has an active surface that has functional elements, the contacts pad being formed at one edge of the active surface, the wire bond has a diameter less than 40 microns and the arc extends more than 100 microns above the active surface of the die. Preferably, the gas flow is transverse to a drop trajectory extending from the jet to the wire bonds, and directed away from the die.

Preferably, the wire bonds are formed such that they extend less than 150 microns above the active surface of the die. In a further preferred form, the wire bonds extend less than 90 microns above the active surface of the die.

Preferably, the step of providing a series of wire bonds is performed using a wedge bonder that welds a wire to the PCB, then moves towards the die, then away from the die and subsequently towards the die again to weld then wire to the die, such that the wire bond forms a curved heel immediately adjacent the weld to the PCB, and an arc extending to the die, the arc having a peak positioned closer to the PCB because of the curved heel.

In a further preferred form, the active surface of the die is planar and the method further comprises the step of positioning the die and the PCB beneath the jetter such that the drop trajectory is vertical and the active surface of the die is inclined to the horizontal such that the bead of the fill encapsulant has a peak that is further from the active than if the bead were deposited when the die was horizontal. Preferably, the active surface is inclined at 10 to 15 degrees to the horizontal.

Preferably, the dam encapsulant is an epoxy material has a viscosity greater than 700 cp when uncured. In a particularly preferred form, the dam encapsulant being an epoxy material that is thixotropic when uncured.

Preferably, the active surface has functional elements spaced less than 260 microns from the contacts pads of the die. In a particularly preferred form, the die is an inkjet printhead IC and the functional elements are nozzles through which ink is ejected. In some embodiments, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area.

Preferably, the chip mounting area is raised more than 100 microns relative to the conductor mounting area. Preferably, the support structure has a step between the chip mounting area and the conductor mounting area. In some embodiments, the plurality of conductors are incorporated into a flexible printed circuit board (flex PCB) with a line of bond pads along an edge closest the die, the bond pads being more than 2 mm from the contacts pads on the die.

Preferably, the support structure is a liquid crystal polymer (LCP) molding.

According to a third aspect, the present invention provides a method of reducing voids within a bead of encapsulant material deposited on a series of wire bonds connecting a micro-electronic device with die contact pads extending along one edge, and a plurality of conductors on a support structure such that the wire bonds extend across a gap defined between the edge of the micro-electronic device and the plurality of conductors, the method comprising the steps of:

depositing at least one transverse bead of encapsulant in the gap extending at an angle to the edge of the micro-electronic device; and, depositing at least one longitudinal bead of encapsulant in the gap extending parallel to the edge of the micro-electronic device.

A small transverse bead of encapsulant across the gap between the die and the PCB will disrupt any hard edges such as the edge of the die, the edge of the die attach film or the step in the LCP support molding. These hard edges provide points where a growing bead of encapsulant can pin its meniscus. As the bead fills behind the meniscus, it The invention has found that the encapsulant can be effectively shaped by a profiling surface without stripping the encapsulant from the wire bonds. The normally convex-shaped upper surface of the encapsulant bead can be pushed to one side of the bead with the profiling surface. With a lower encapsulant bead, the active surface can be brought into closer proximity with another surface without making contact. For example, the nozzle array on a printhead IC can be 300 microns to 400 microns from the paper path. By collapsing or flattening the wire bond arcs before applying and profiling a bead of encapsulant, the nozzle array on the printhead IC can be less than 100 microns from the paper path.

Preferably, the wire bonds extend in an arc from respective contact pads on the die to corresponding conductors on the support structure and the method further comprises the steps of:

pushing on the wire bonds to plastically deform the wire bonds; and, releasing the wire bond such that plastic deformation maintains the wire bond in a flatter profile shape.

Preferably, the die has an active surface that has functional elements, the contacts pad being formed at one edge of the active surface, the wire bond has a diameter less than 40 microns and the arc extends more than 100 microns above the active surface of the die.

Preferably, the wire bond is plastically deformed such that it extends less than 50 microns above the active surface of the die.

Preferably, the wire bond is pushed by engagement with a blade having a rounded edge section for contacting the wire bond.

Preferably, the bead of encapsulant has a profiled surface that is flat, parallel to and spaced less than 100 microns from the active surface.

Preferably, the bead of encapsulant has a profiled surface that is flat and inclined relative to the active surface.

Preferably, the encapsulant being an epoxy material has a viscosity greater than 700 cp when uncured.

Preferably, the encapsulant being an epoxy material that is thixotropic when uncured.

Preferably, the method further comprises the steps of:

positioning the profiling surface adjacent and spaced from the active surface to define a gap; and, applying the bead of encapsulant onto the contact pads such that one side of the bead contacts the profiling surface and a portion of the bead extends into the gap and onto the active surface.

Preferably, the active surface has functional elements spaced less than 260 microns from the contacts pads of the die. In a further preferred form, the die is an inkjet printhead IC and the functional elements are nozzles through which ink is ejected. In some embodiments, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area.

Preferably, the chip mounting area is raised more than 100 microns relative to the conductor mounting area. In a particularly preferred form, the support structure has a step between the chip mounting area and the conductor mounting area.

Preferably, the plurality of conductors are incorporated into a flexible printed circuit board (flex PCB) with a line of bond pads along an edge closest the die, the bond pads being more than 2 mm from the contacts pads on the die.

Preferably, the support structure is a liquid crystal polymer (LCP) molding.

According to a fourth aspect, the present invention provides a method of applying encapsulant to a die mounted to a support structure, the method comprising the steps of:

providing a die mounted to the support structure, the die having a back surface in contact with the support structure and an active surface opposing the back surface, the active surface having electrical contact pads;

positioning a barrier proximate the electrical contact pads and spaced from the active surface to define a gap; and, depositing a bead of encapsulant onto the electrical contact pads such that one side of the bead contacts the barrier and a portion of the bead extends into the gap and onto the active surface.

Placing a barrier over the active surface so that it defines a narrow gap allows the geometry of the encapsulant front (the line of contact between the encapsulant and the active surface) can be more closely controlled. Any variation in the flowrate of encapsulant from the needle tends to cause bulges or valleys in the height of the bead and or the PCB side of the bead. The fluidic resistance generated by the gap between the barrier and the active surface means that the amount of encapsulant that flows into the gap and onto the active surface is almost constant. The reduced flow variations make the encapsulant front closely correspond to the shape of the barrier. Greater control of the encapsulant front allows the functional elements of the active surface of the die to be closer to the contact pads.

Preferably, the barrier is a profiling surface and the method further comprises the steps of:

moving the profiling surface over the active surface to flatten the bead of encapsulant.

Preferably, the method further comprises the steps of:

prior to depositing the bead of encapsulant, electrically connecting the contact pads on the die to respective conductors on the support structure with wire bonds, the wire bonds each extending in an arc from the contact pad to the conductor;

pushing on the wire bonds to collapse the arc and plastically deform the wire bond; and, releasing the wire bonds such that plastic deformation maintain the wire bonds in a flatter profile shape.

In a further preferred form, the active surface that has functional elements, the contacts pad being formed at one edge of the active surface, the wire bond has a diameter less than 40 microns and the arc extends more than 100 microns above the active surface of the die.

Preferably, the wire bond is plastically deformed such that it extends less than 50 microns above the active surface of the die. In another preferred form, the wire bond is pushed by engagement with a blade having a rounded edge section for contacting the wire bond.

Preferably, the bead of encapsulant has a profiled surface that is flat, parallel to and spaced less than 100 microns from the active surface.

Optionally, the bead of encapsulant has a profiled surface that is flat and inclined relative to the active surface.

Preferably, the encapsulant being an epoxy material has a viscosity greater than 700 cp when uncured.

Preferably, the encapsulant is an epoxy material that is thixotropic when uncured.

Preferably, the active surface has functional elements spaced less than 260 microns from the contacts pads of the die. In a particularly preferred form, the die is an inkjet printhead IC and the functional elements are nozzles through which ink is ejected. Preferably, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area. In a particularly preferred form, the chip mounting area is raised more than 100 microns relative to the conductor mounting area. In preferred embodiments, the support structure has a step between the chip mounting area and the conductor mounting area. In particularly preferred embodiments, the plurality of conductors are incorporated into a flexible printed circuit board (flex PCB) with a line of bond pads along an edge closest the die, the bond pads being more than 2 mm from the contacts pads on the die.

Preferably, the support structure is a liquid crystal polymer (LCP) molding.

According to a fifth aspect, the present invention provides a method of applying encapsulant to wire bonds between a die and conductors on a supporting substrate, the method comprising the steps of:

forming a bead of the encapsulant on a profiling surface;

positioning the profiling surface such that the bead contacts the die; and, moving the profiling surface relative to the die to cover the wire bonds with the encapsulant.

Wiping the encapsulant over the wire bonds with a profiling surface provides control of the encapsulant front as well as the height of the encapsulant relative to the die. The movement of the profiling surface relative to the die can closely controlled to shape the encapsulant to a desired form. Using the example of a printhead die, the encapsulant can be shaped to present an inclined face rising from the nozzle surface to a high point over the wire bonds. This can be used by the printhead maintenance facilities to maintain contact pressure on the wiping mechanism. This is illustrated further below with reference to the drawings. However, it will be appreciated that the encapsulant can be shaped to have ridges, gutters, grooves and so on by using a particular shape of profiling surface and relative movement with the die.

Preferably, the method further comprises the steps of:

dipping the profiling surface into a reservoir of the encapsulant material to form a the bead of encapsulant material on the profiling surface.

Optionally, the profiling surface is a blade with a straight edge and the method further comprises the steps of:

orienting the blade such that the straight edge is lowest and dipping the straight edge into the encapsulant material to form the bead of encapsulant along the straight edge.

Preferably, the die has an active surface with functional elements and a plurality of contacts pad being formed along one edge for connection with the wire bonds such that the wire bonds extend in an arc from the contacts pads to each of the conductors respectively, the wire bonds having a diameter less than 40 microns and the arc extends more than 100 microns above the active surface of the die.

Preferably, the method further comprises the steps of:

prior to encapsulation, pushing on the wire bonds to collapse the arc and plastically deform the wire bonds; and, releasing the wire bonds such that plastic deformation maintains the wire bonds in a flatter profile shape.

Preferably, the wire bond is plastically deformed such that it extends less than 50 microns above the active surface of the die. Preferably, the wire bond is pushed by engagement with a blade having a rounded edge section for contacting the wire bond.

Preferably, the encapsulant covering the wire bonds has a profiled surface that is flat, parallel to and spaced less than 100 microns from the active surface.

Preferably, the bead of encapsulant having a profiled surface that is flat and inclined relative to the active surface.

Preferably, the encapsulant being an epoxy material has a viscosity greater than 700 cp when uncured.

Preferably, the encapsulant is an epoxy material that is thixotropic when uncured. Preferably, the functional elements are spaced less than 260 microns from the contacts pads of the die. In a further preferred form, the die is an inkjet printhead IC and the functional elements are nozzles through which ink is ejected. Optionally, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area. In a particularly preferred form, the chip mounting area is raised more than 100 microns relative to the conductor mounting area. In another preferred form, the support structure has a step between the chip mounting area and the conductor mounting area. In a preferred embodiment, the plurality of conductors are incorporated into a flexible printed circuit board (flex PCB) with a line of bond pads along an edge closest the die, the bond pads being more than 2 mm from the contacts pads on the die. In some embodiments, the support structure is a liquid crystal polymer (LCP) molding.

BRIEF DESCRIPTION OF THE DRAWINGS

Embodiments of the invention will now be described by way of example only with reference to the accompanying drawings, in which.

DETAILED DESCRIPTION OF PREFERRED EMBODIMENTS

Figure 1:
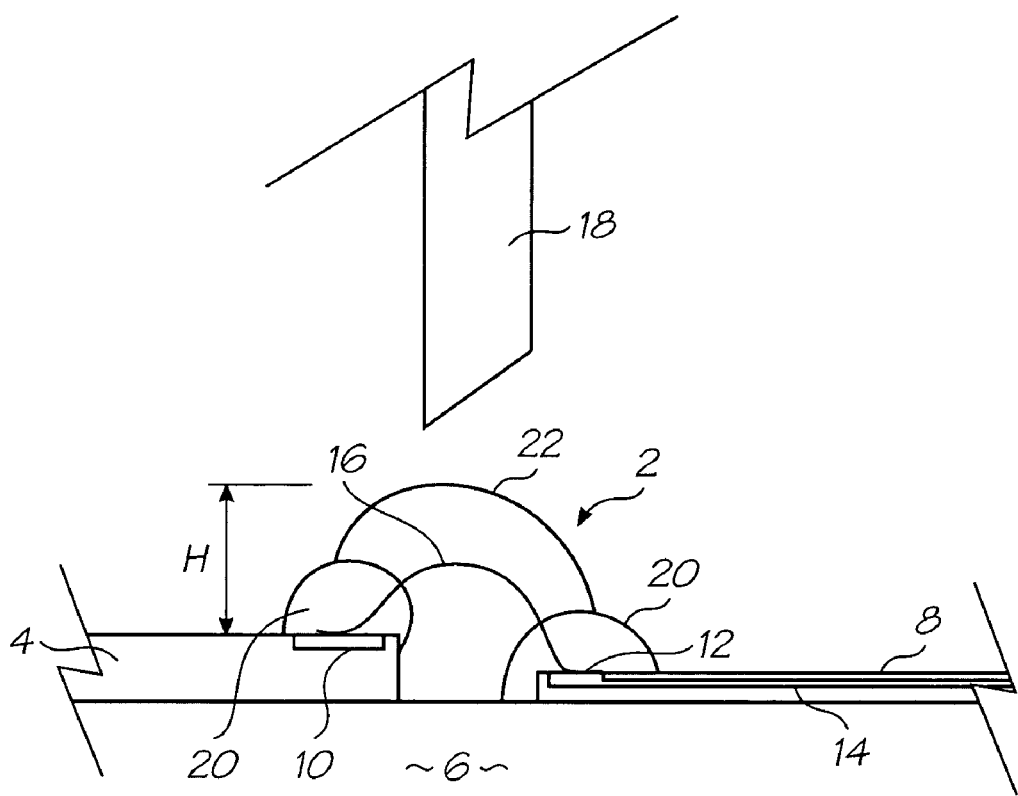
FIG. 1 is a schematic representation of a common prior art technique for applying a bead of encapsulant to wire bonds.

FIG. 1 shows a common technique used for applying a bead encapsulant to wire bonds. A die 4 is mounted to a supporting structure 6 adjacent the edge of a flex PCB 8 (flexible printed circuit board). The die 4 has a line of contact pads 10 along one edge and the flex PCB 8 has corresponding bond pads 12. Wire bonds 16 extend from the bond pads 10 to the bonds pads 12. Power and data is transmitted to the die 4 via conductive traces 14 in the flex PCB 8. This is a simplified representation of the dies mounted within many electronic devices. The printhead IC dies mounted to the LCP (liquid crystal polymer) molding to receive print data from an adjacent flex PCB, as described in U.S. Ser. No. 11/014,769 incorporated herein by cross reference, is one example of this type of die mounting arrangement. The ordinary worker will appreciate that the die may also be mounted directly to a hard PCB with traces formed thereon.

The wire bonds 16 are covered in a bead on encapsulant 2 to protect and reinforce the bonds. The encapsulant 2 is dispensed from a discharge needle 18 directly onto the wire bonds 16. Often the encapsulant bead 2 is three separate beads—two beads of so-called 'dam' encapsulant 20, and one bead of 'fill' encapsulant 22. The dam encapsulant 20 has a higher viscosity than the fill encapsulant 22, and serves to form a channel to hold the fill encapsulant bead. The height H of the bead 2 above the die 4 is usually about 500-600 microns. In most electronic devices, this does not pose a problem. However, if the die has an active surface that needs to operate in close proximity to another surface, this bead can be an obstruction.

Elevating the Die Relative to the Flex PCB

Figure 2:
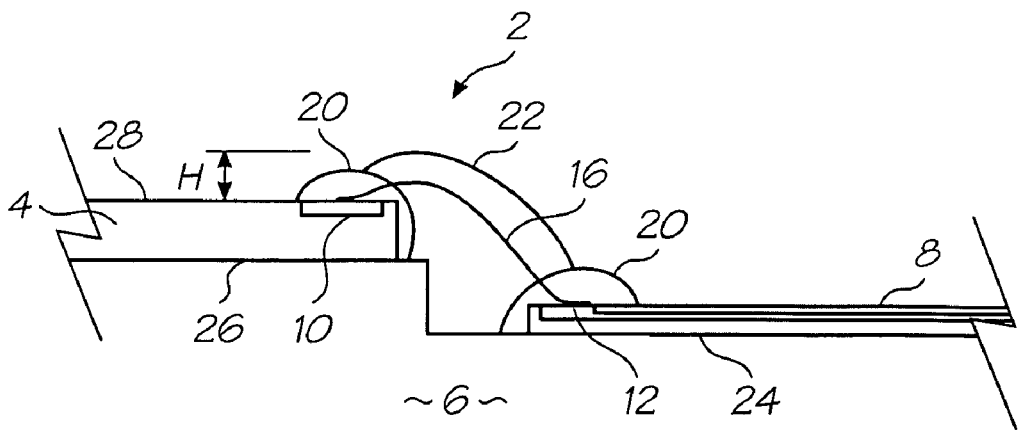
FIG. 2 is a schematic representation of a die mounted to a supporting structure with a chip mounting area raised relative to the flex PCB mounting area.

FIG. 2 shows a stepped support structure 6 that has raised the chip mounting area 26 relative to the PCB mounting area 24 (or at least the area mounting the PCB bonds pads 12). With the die 4 on a raised chip mounting area 26, the arc of the wire bonds 16 are lower relative to active surface 28 of the die 4. In fact, the end of the wire bond 16 attached to the contact pad 10 can be the apex of the arc (bearing in mind that the wire bond arc is intended to accommodate some relative movement of the die and PCB). When the wire bonds 16 are covered with encapsulant 2, the bead has a reduced height H above the active surface 28 of the die 4. If the bead of encapsulant 2 uses two beads of dam encapsulant 24 and a fill encapsulant 22, the positions, volumes and viscosities of the beads need to take the step into account. Bead heights less than 100 microns are easily achievable, and with additional measures, such as wire arc collapsing and bead profiling (discussed below), bead height of less than 50 microns are possible.

With the die 4 raised above the flex PCB 8 by 410 microns, the height of the wire bonds 16 above the die is about 34 microns. With the die raised 610 microns above the flex PCB, the wire bond height is around 20 microns. Raising the die even further has shown little or no further reduction in wire bond height with a step of 710 microns having a wire bond height of around 20 microns.

Shaping the Encapsulant Bead with a Profiling Blade

Figure 3A:
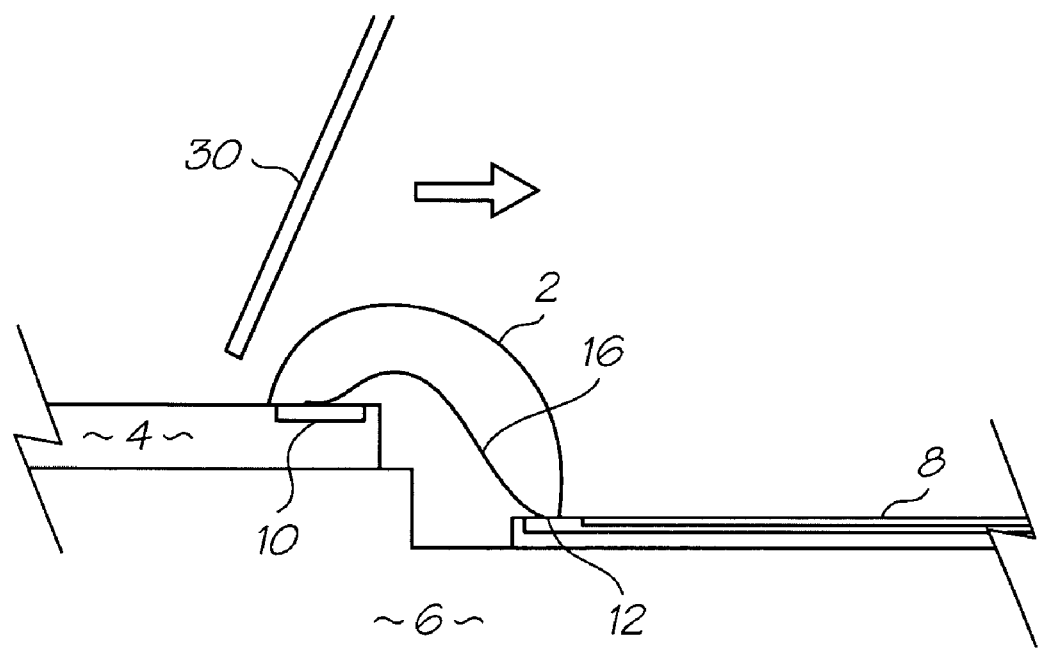
FIGS. 3A, 3B and 3C are schematic representations of the encapsulant bead being profiled into a desired shape using a moveable blade.
Figure 3B:
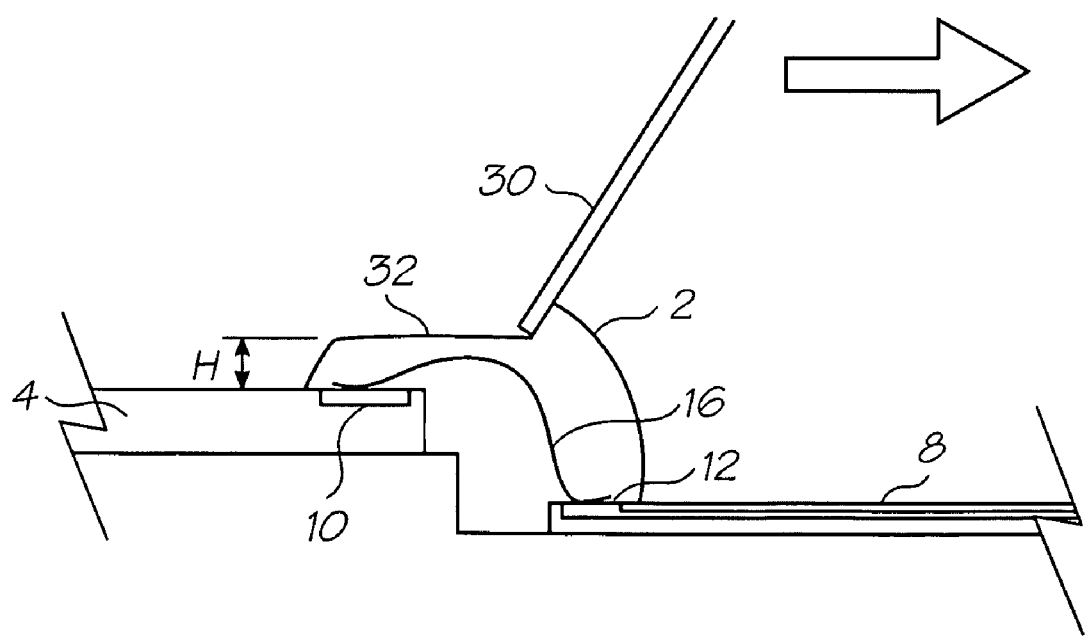
Figure 3C:
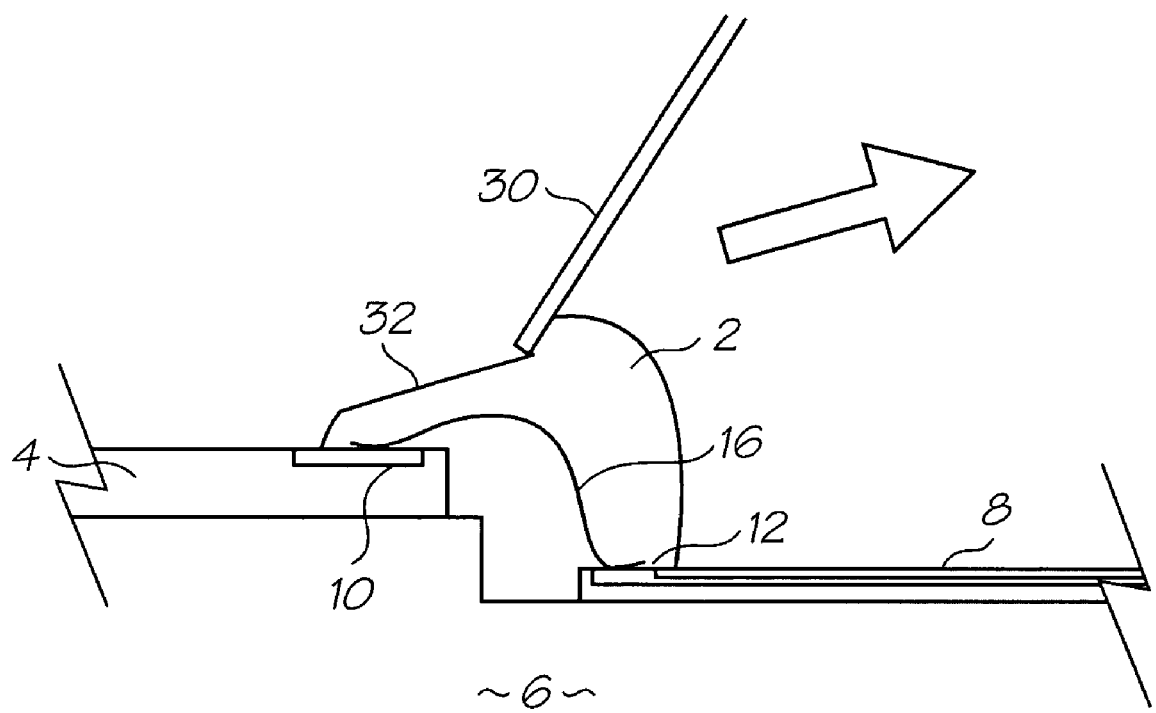

FIGS. 3A to 3C show the encapsulant 2 being profiled with a profiling blade 30. The support structure 6 is again stepped to reduce the height of the wire bonds 16 above the die 4. Before the epoxy encapsulant 2 has cured, the profiling blade 30 moves across the die 4 and wire bonds in a predetermined path. As shown in FIG. 3B, the blade 30 displaces the top of the bead 30 to its flex PCB side to form a flat top surface 32 that is at a significantly reduced height H above the die 4.

The encapsulant bead 2 may be a plurality of separate beads as shown in FIGS. 1 and 2, or a single bead of one material. However, for close dimensional control of the profiled encapsulant, the encapsulant materials used should be thixotropic—that is, once deposited from the discharge needle, or profiled by the blade 30, the material should not flow under its own weight, but rather hold its form until it cures. This requires the epoxy to have an uncured viscosity greater than about 700 cp. A suitable encapsulant is DYMAX 9001-E-v3.1 Chip Encapsulant produced by Dymax Corporation with a viscosity of approximately 800 cp when uncured. The blade 30 may be ceramic (glass) or metal and preferably about 200 microns thick.

It will be appreciated that the relative movement of the blade 30 and the die 4 can be precisely controlled. This allows the height H to be determined by the tolerance of the wire bonding process. As long as H is greater than the nominal height of the wire bond arc above the die, plus the maximum tolerance, the encapsulant 2 will cover and protect the wire bonds 16. With this technique, the height H can be easily reduced from 500-600 microns to less than 300 microns. If the heights of the wire bond arcs are also reduced, the height H of the encapsulant bead can be less than 100 microns. The Applicant uses this technique to profile encapsulant on printhead dies down to a height of 50 microns at its lowest point. As shown in FIG. 3C, the lowest point is at the encapsulant front and the blade 30 forms an inclined face 32 in the top of the bead 2. The inclined face is utilized by the printhead maintenance system when cleaning the paper dust and dried ink from the nozzle face. This illustrates the technique's ability to not just reduce the height of the encapsulant bead, but to form a surface that can perform functions other than just encapsulate the wire bonds. The edge profile of the blade and the path of the blade relative to the die can be configured to form a surface that has a multitude of shapes for a variety of purposes.

Plastic Deformation of the Wire Bond Arcs

Figure 4A:
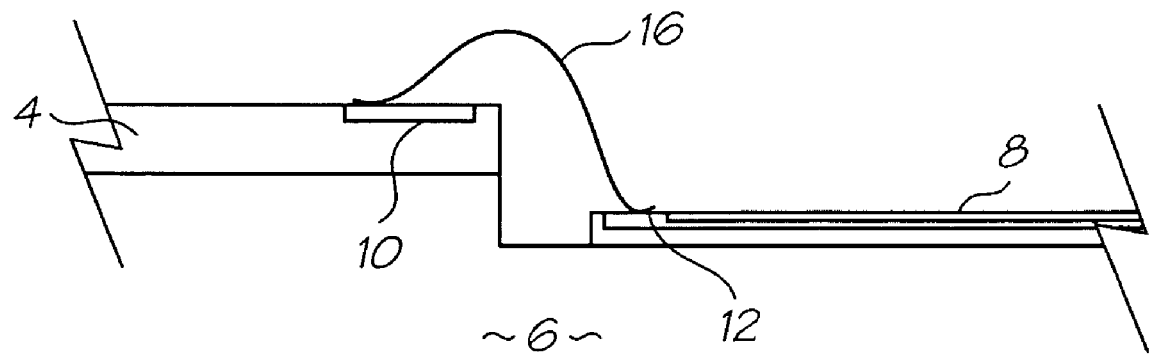
FIGS. 4A to 4D are schematic representations of wire bonds being profiled by plastic deformation.
Figure 4B:
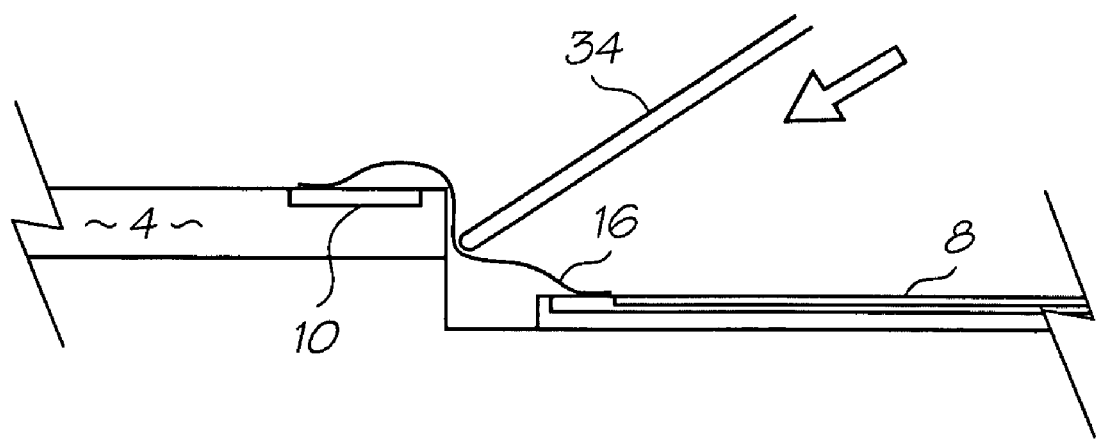
Figure 4C:
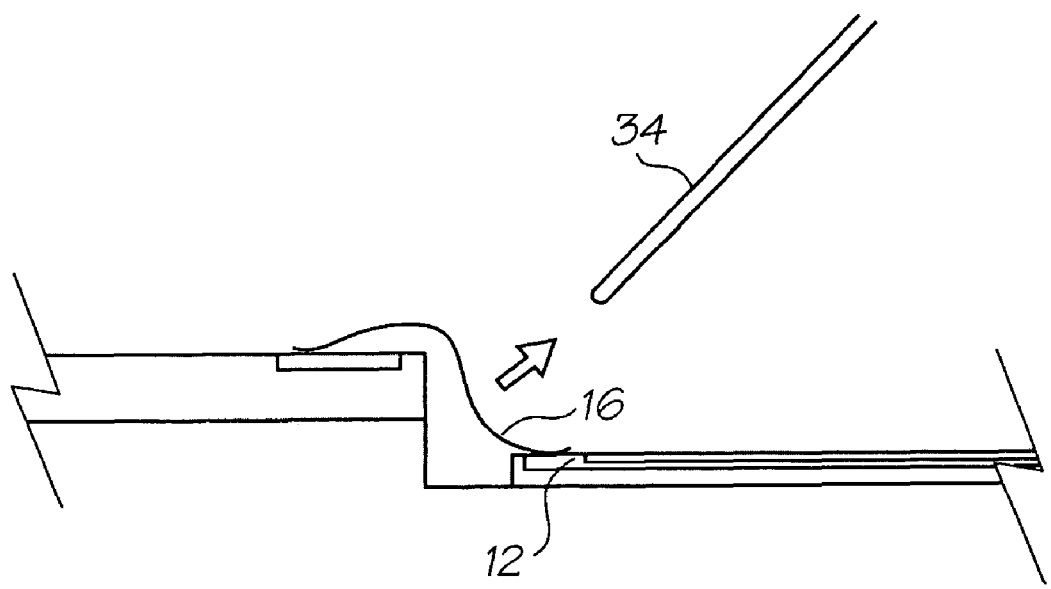

FIGS. 4A to 4C show another technique for lowering the profile of wire bonds. FIG. 4A shows the die 4 connected to the flex PCB 8 via the wire bonds 16. While the stepped support structure 6 has lowered the height of the wire bond arcs compared to a flat supporting structure, the wire bonds still have a natural tendency to bow upwards rather than downwards towards the corner of the step. The wires 16 are typically about 32 microns in diameter and have a pull force of about 3 to 5 grams force. The pull force is the tensile load necessary to break the connection to the contact pad 10 or the bond pad 12. Given the fragility of these structures (one of the reasons encapsulant is applied), conventional wisdom is to avoid any contact between the wire bond arcs and other solid surfaces.

As shown in FIG. 4B, the arc of the wire bonds 16 can be collapsed by a wire pusher 34. The wire pusher 34 displaces the wire bond 16 enough to elastically and plastically deform the arc. The Applicants have shown that contact with the wire pusher 34 can cause localized work hardening in the wire, but as long as the pushing force is not excessive, it does not break. The end of the wire pusher 34 is rounded to avoid stress concentration points. The wire pusher may be a stylus for engaging single wire bonds or a blade that pushes on multiple wire bonds simultaneously.

Referring now to FIG. 4C, the wire pusher 34 is retracted and the wire springs back toward its original shape to relieve the elastic deformation. However, the plastic deformation remains and the wire bond height above the die 4 is much reduced. Testing has shown that an initial wire bond loop height of 200 microns can be reduced to about 45 microns using this technique. Tests have also shown that the pull strength of the plastically deformed wires remains at about 3 to 5 grams force.

The collapse of the wire bonds is uncontrolled and leaves the wire bonds somewhat randomly deformed. However, pushing the wire bonds closer to the die provides more uniformly shaped collapsed wire bonds. The Applicant's work has shown that engaging the wires about 200 to 300 microns for the die provides the best results.

Figure 4D:
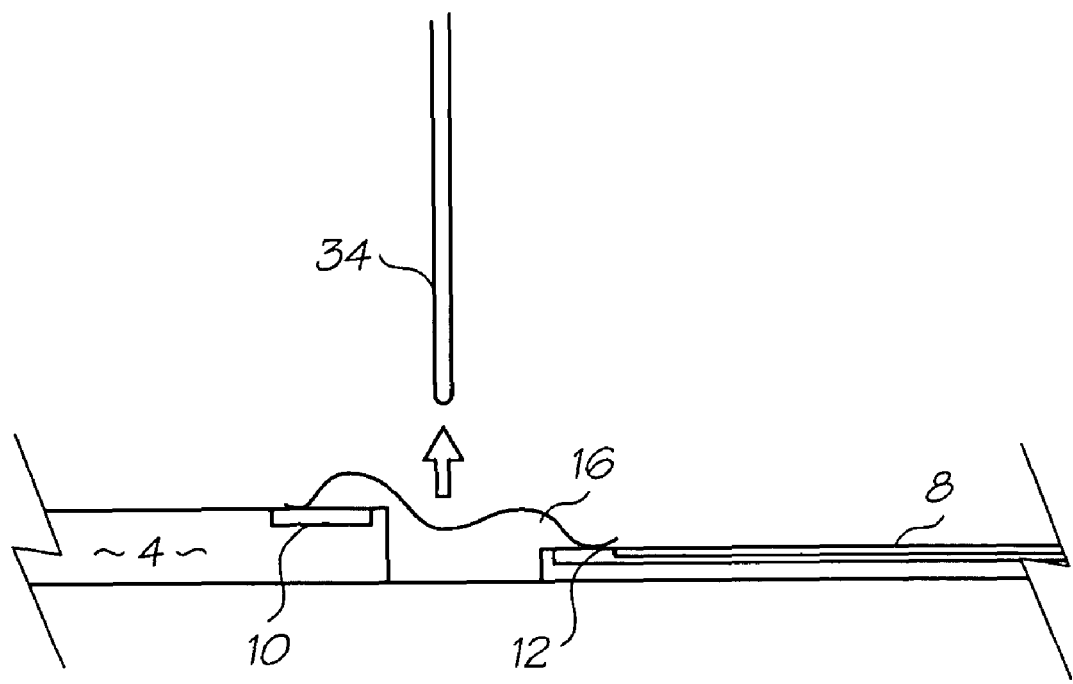

As shown in FIG. 4D, the die 4 and the flex PCB 8 are mounted to a flat support structure 6. As discussed above, this means the original loop height of the wire bond arc is much higher—approximately 400 microns above the die 4. Consequently, the wire has more plastic deformation when the loop is collapsed by the wire pusher. Even so, the Applicants results show that the residual loop height after pushing is about 20-50 microns.

Figure 5A:
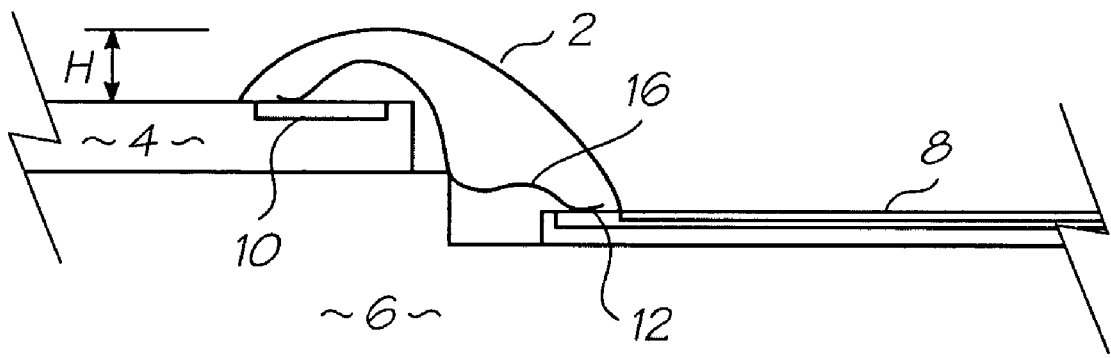
FIGS. 5A and 5B show the encapsulant bead height reductions for plastically deformed wire bonds.
Figure 5B:
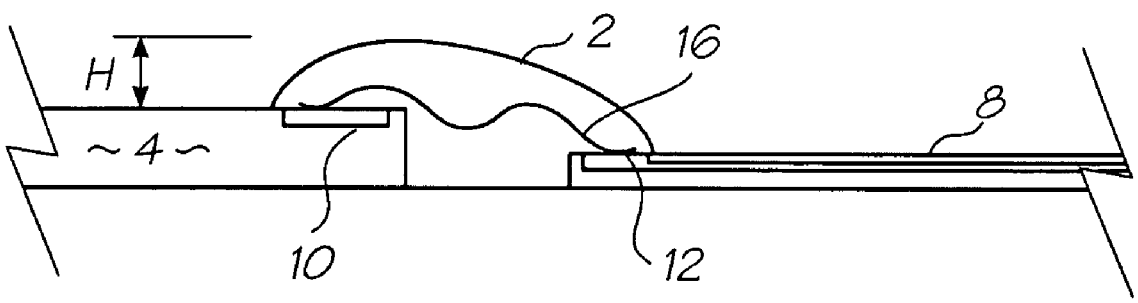

FIGS. 5A and 5B show the collapsed wire bonds 16 covered with an encapsulant bead 2. Even without bead profiling prior to curing, the height H of the bead above the die is much less than the bead necessary to encapsulate the original undeformed wire loops.

Applying Encapsulant with Profiling Blade

Figure 6A:
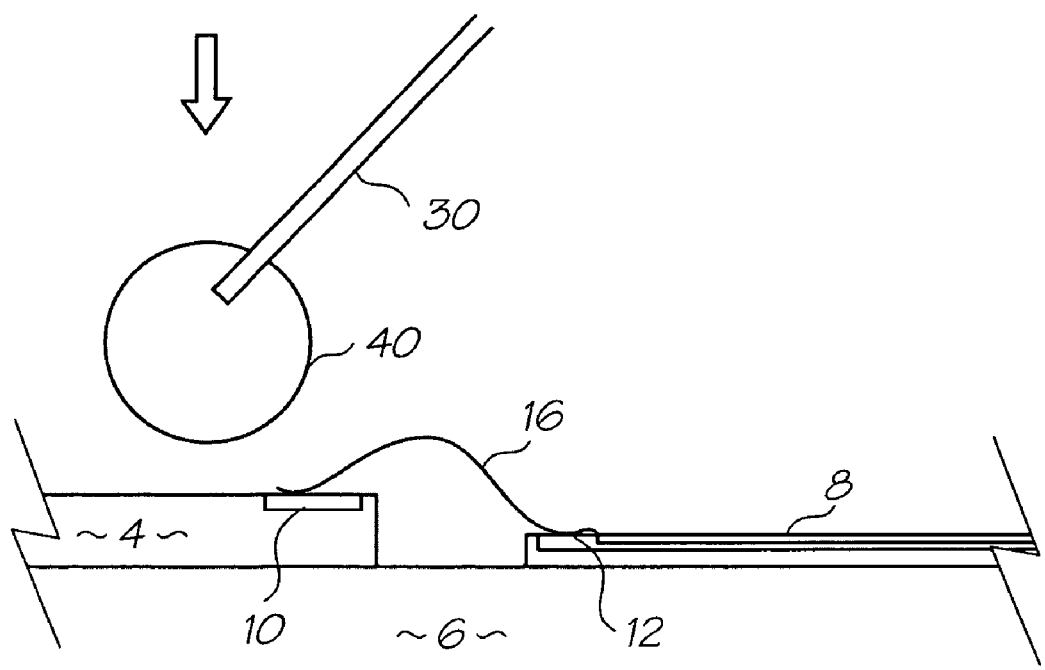
FIGS. 6A to 6C show the encapsulant bead being applied to the wire bonds using the profiling blade.
Figure 6B:
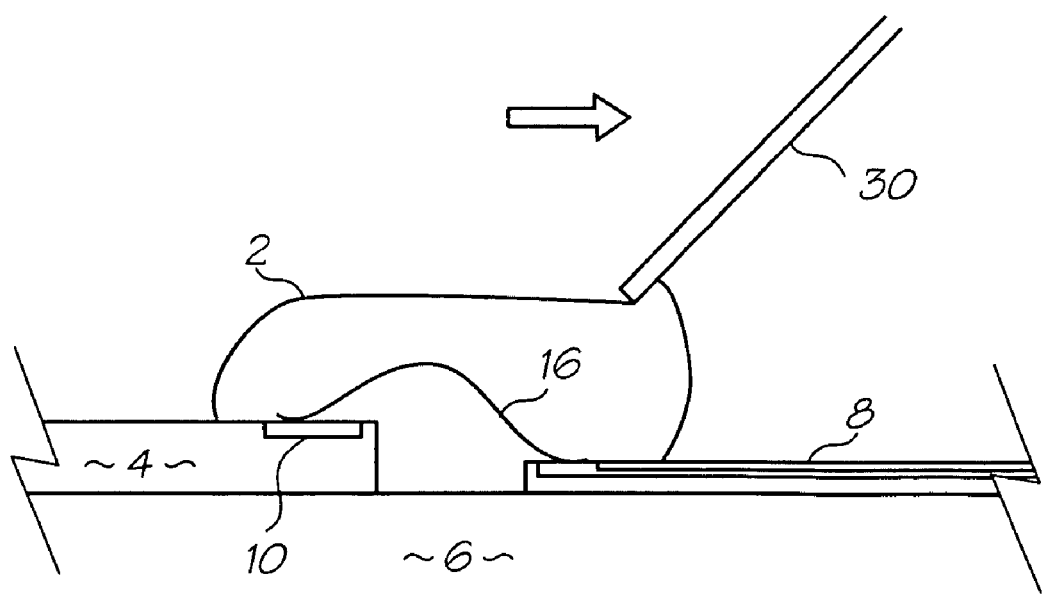
Figure 6C:
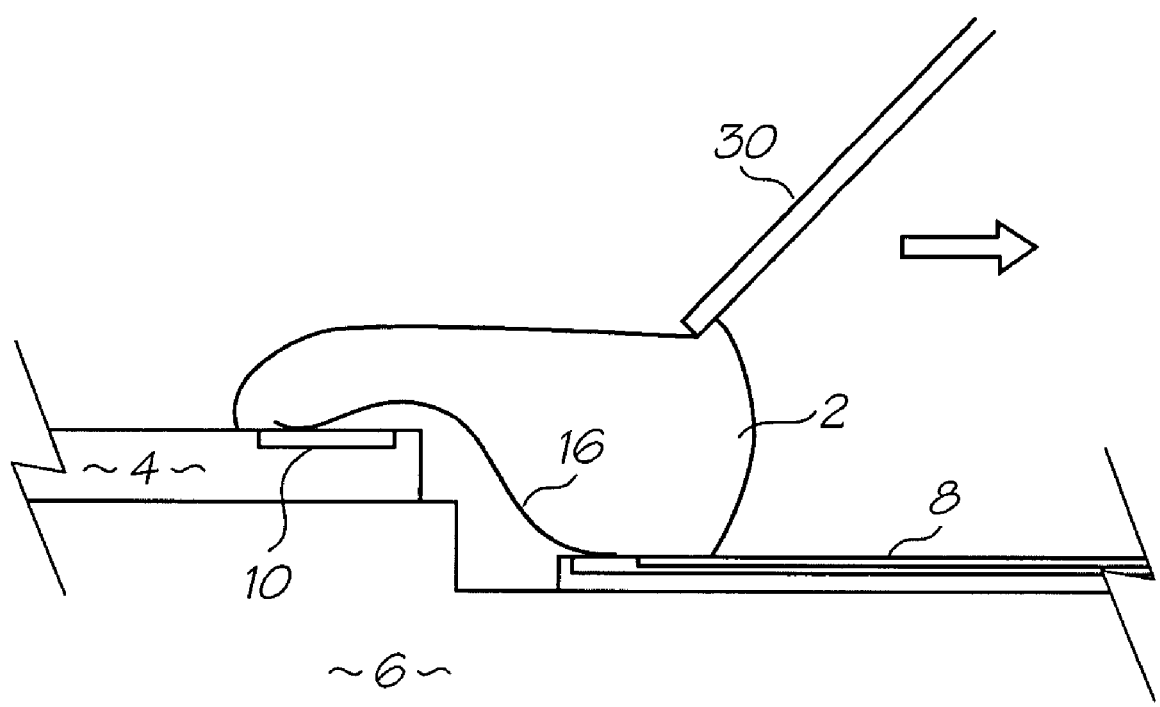

FIGS. 6A, 6B and 6C show the application of the encapsulant bead using the profiling blade 30 instead of a discharge needle (see FIGS. 1 and 2). As previously discussed, the flowrate of encapsulant from the discharge needle can vary and this gives rise to large variations on the position of the encapsulant front on the active surface of the die 4. Consequently, any functional elements in the active surface of the die need to be sufficiently spaced from the contacts pads 10 to allow for the meandering encapsulant front.

Applying the encapsulant with the profiling blade avoids the problems caused by the flowrate fluctuations from the discharge needle. As shown in FIG. 6A, the bead of encapsulant 40 can be formed on the profiling blade 30 by simply dipping it into a reservoir of uncured encapsulant epoxy. Of course, the bead 40 may also be formed by any other convenient method, such as running the discharge needle along one end of the blade 30.

FIG. 6B show the blade 30 having been lowered to touch the bead 40 onto the die 4. When the encapsulant material touches the die surface, it wets and wicks along the surface while remaining pinned to the edge of the blade. The blade 30 is held at a predetermined height above the die 4 and moved over the bead 2 to flatten and lower its profile. The encapsulant displaced from the top of the bead 2 by the blade 30, spreads over the PCB side of the bead 2. It is not relevant if the encapsulant spreads further over the PCB than necessary. As long as the wire bonds 16 and the bonds pads 12 are covered, any additional encapsulant on the PCB 8 surface is not detrimental.

In FIG. 6C, the wire bond 16 height has been reduced by collapsing the arc in accordance with the techniques discussed above. As previously discussed, the bead 2 deposited by the discharge needle need not be as big to cover the wire bond 16 once it has been collapsed. Furthermore, the blade 30 can be brought closer to the die 4 without contacting wire bonds 16 when profiling the encapsulant 2. Hence the bead profile in FIG. 6C is substantially lower than that of FIG. 6B.

Encapsulant Front Control

When the encapsulant material is dispensed from the discharge needle, minor variations in the flowrate can cause the bead to bulge at points of higher flow. Consequently, the side of the bead that contacts the active surface of the die is not straight, but has significant perturbations. These perturbations have to be accommodated between the contact pads and any functional elements on the active surface. The spacing between the contacts pads and the functional elements consumes valuable 'chip real estate'. The Applicant has previously developed printhead dies with a spacing of 260 microns between the contact pads and the first row of nozzles. Better control of the encapsulant front reduces the space between the contacts and operational elements, and so the overall dimensions of the die. Hence the design can be more compact and more chips fabricated from the original wafer disc.

Figure 7A:
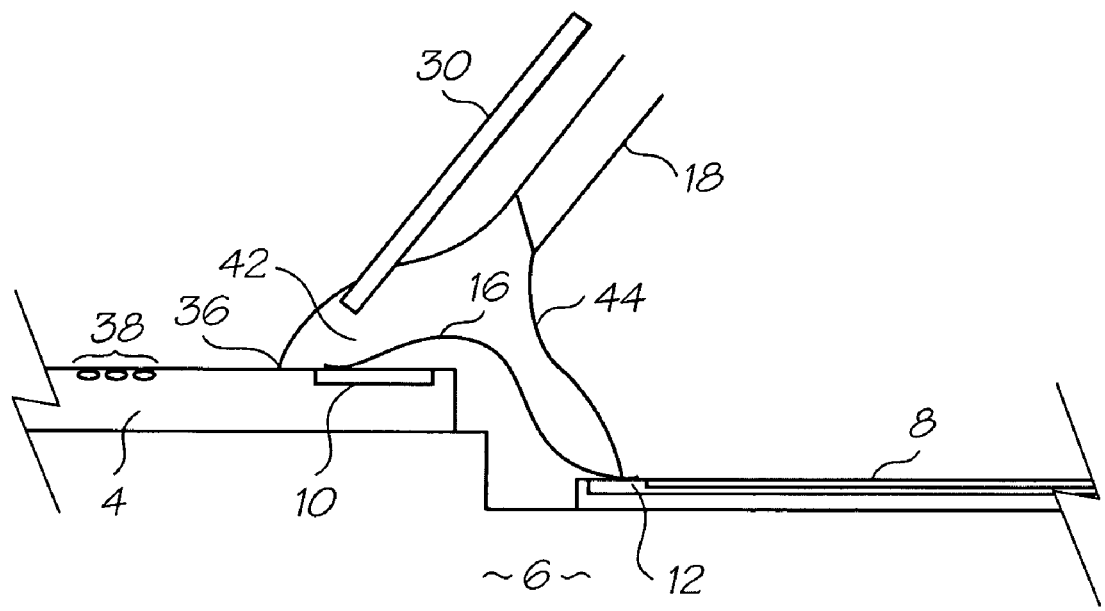
FIGS. 7A and 7B show the profiling blade being used to control the encapsulant bead front on the surface of the die.
Figure 7B:
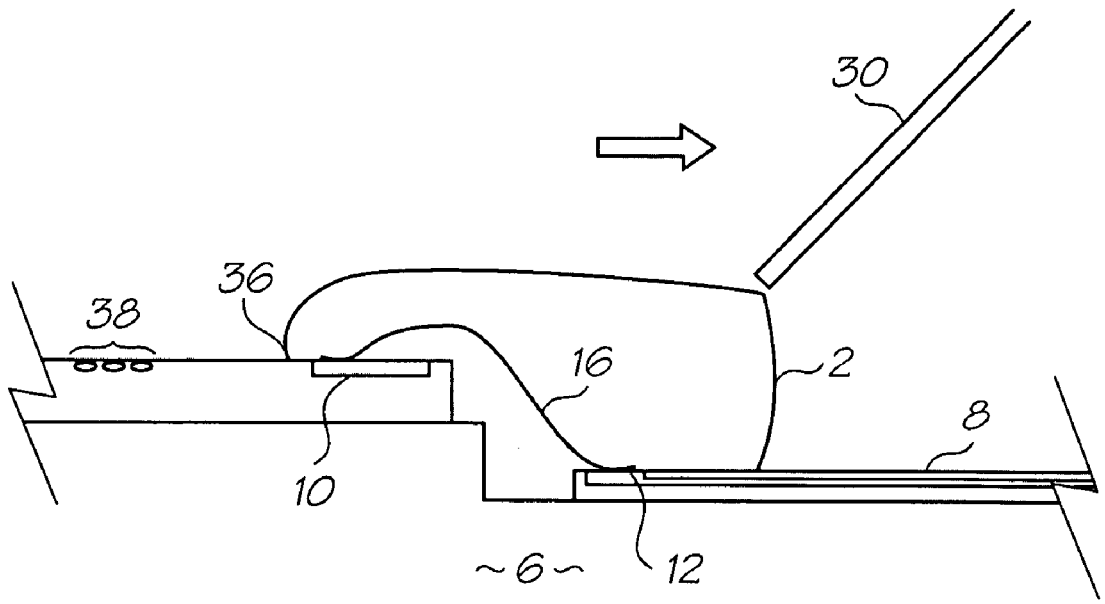

As shown in FIGS. 7A and 7B, the profiling blade 30 is used to control the front 36 of the bead of encapsulant 2. The blade 30 is positioned over the die 4 to define a gap 42 between its lower edge and the active surface 28. As the discharge needle 18 dispenses the encapsulant material 44, it flows onto the active surface, one side of the blade and a fillet of the material extends through the gap 42. Because of the flow restriction created by the gap, flow variations have a reduced effect on the dimensions of the fillet that flows through the gap. Therefore the encapsulant front 36 closely corresponds to the line of the lower edge of the blade 30.

As shown in FIG. 7B, the profiling blade 30 is already in position to profile the encapsulant bead 2 once it has been dispensed from the discharge needle. The blade 30 simply moves over the die 4 in a direction away from the nozzles 38. This keeps the encapsulant front 36 in place and flattens the profile of the encapsulant bead 2 over the wire bonds 16.

Using Low Modulus Fill Encapsulant to Decrease Stress at Wire Bond Ends

Figure 8:
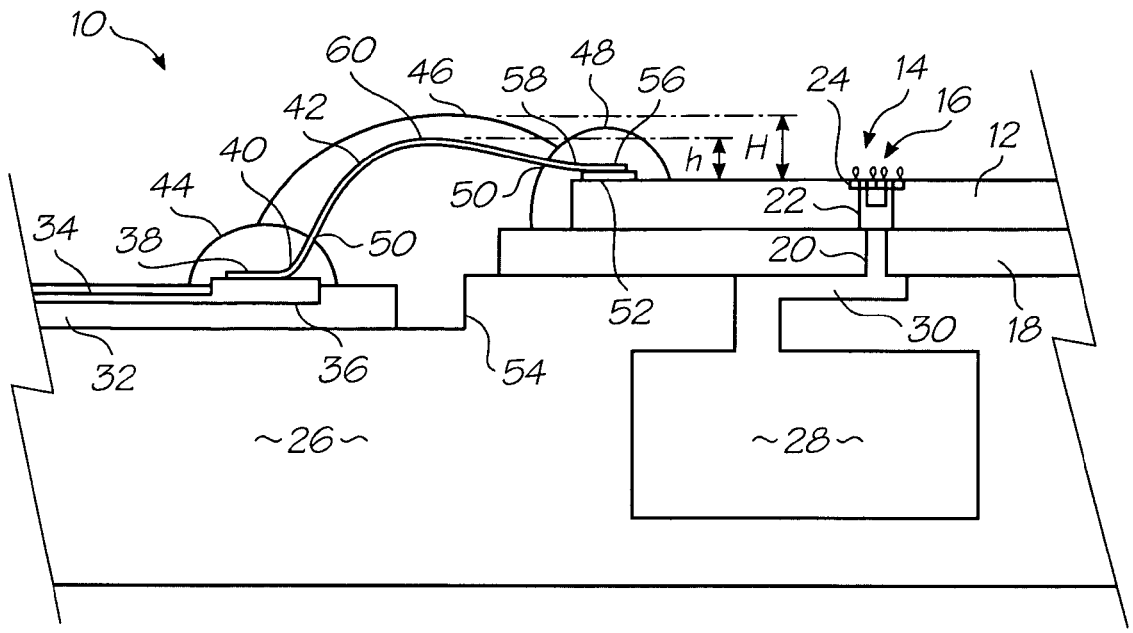
FIG. 8 is a schematic representation of the wire bond encapsulated by a bead of low elastic modulus fill encapsulant between beads of higher modulus dam encapsulant.

FIG. 8 shows a schematic section view of the die 12 bonded to a support structure that comprises an LCP molding 26, a die attach film 18 and a flex PCB 32. The flex PCB 32 has conductive traces 34 leading to the PCB contact pads 36. Wire bonds 42 electrically connect the PCB pads 36 with respective electrical contact pads 52 along one edge of the die 12. The die 12 is a printhead integrated circuit with an active surface comprising an array of ink ejection nozzles 14. The LCP molding 26 has a main ink conduit 28 which feeds ink to a smaller surface channel 30 in fluid communication with a laser ablated hole 20 in the die attach film 18. The printhead IC 12 has an attachment face opposite the array of nozzles 14 on the active surface. Print data is transmitted to the nozzles through the flex PCB via the wire bonds.

As discussed above, the LCP molding has a step formation 54 to lower the PCB contact pads 36 relative to the printhead die 12. This reduces the height 'h' of the wire bond peak 60 above the array of nozzles 14. This in turn allows the encapsulant bead 46 to be lower and so the media feed path can be closer to the nozzles.

The temperature variation of the device 10 can be significant. During operation, the heat generated causes thermal expansion of all the components. With differing coefficients of thermal expansion, the wire bonds move relative to the die and the flex PCB. The wire bonds 42, being metallic, expand more than the underlying LCP molding 26, die 12 and flex PCB 32. With the distance between the die contact pads 52 and the PCB contacts 36 typically about 3 mm to 8 mm, the differential expansion of the wire bonds 42 is around 15 microns to 30 microns.

The expansion in the wire bonds causes them to bow slightly upwards within the bead of encapsulant 46. This increases the radius of curvature at the heel 40 of the wire bond 42. The heel 40 connects the welded foot portion 38 to the intermediate section of the wire bonds 42. The operation of a wedge wire bonder 150 (see FIG. 13) is described above. When the tip 152 of the wedge 150 ultrasonically welds the end 38 to the PCB contact 36, it flattens the top of the wire by contact pressure. At the end of the flat portion where it meets the heel 40, the wire returns to a round cross section. This discontinuity in the cross section acts as a stress concentration site. As the device 10 experiences thermal cycling as it goes into and out of operative mode (or even just diurnal temperature variations), the cyclical bending and relaxing at the heel 40 can result in premature fatigue failure.

The Applicant has addressed this with high elastic modulus encapsulant beads along the contacts and the end section of the wire bonds, with a lower elastic modulus fill encapsulant. As shown in FIG. 8, the PCB dam encapsulant 44 encases the PCB contact pads 36, the welded portion of the wire bond 38 and the heel 40. At the other end of the wire bond 42, the welded die end 56, the die heel 58 and the die contact pads 52 are encased in an IC encapsulant bead 48. The die heel 58 has less curvature than the PCB heel 40 and therefore is less prone to premature fatigue failure. However, without the step formation 54 and the particular manner in which the wedge bonder 150 is operated (discussed below), the curvature of the heel at both ends of the wire bond would be roughly equivalent and so both equally prone to premature fatigue failure.

With high modulus dam encapsulant beads 44 and 48, the relatively weak heels 40 and 58 are reinforced. The expansion of the wire bonds 42 relative to the underlying LCP molding 26 is accommodated in the low modulus fill encapsulant 46. This shifts the stress concentration to the interface 50 between the high modulus beads 40 and 58, and low modulus fill encapsulant bead 46. At the interface 50, the wire bond 42 has greater fatigue strength. The cross section is not disrupted and no embrittlement from work hardening.

The Applicant's work shows the dam encapsulant beads should have an elastic modulus between 1 GPa and 3 GPa when cured while and the cured fill encapsulant is between 10 MPa and 500 MPa.

Satellite Droplet Control

Figure 9:
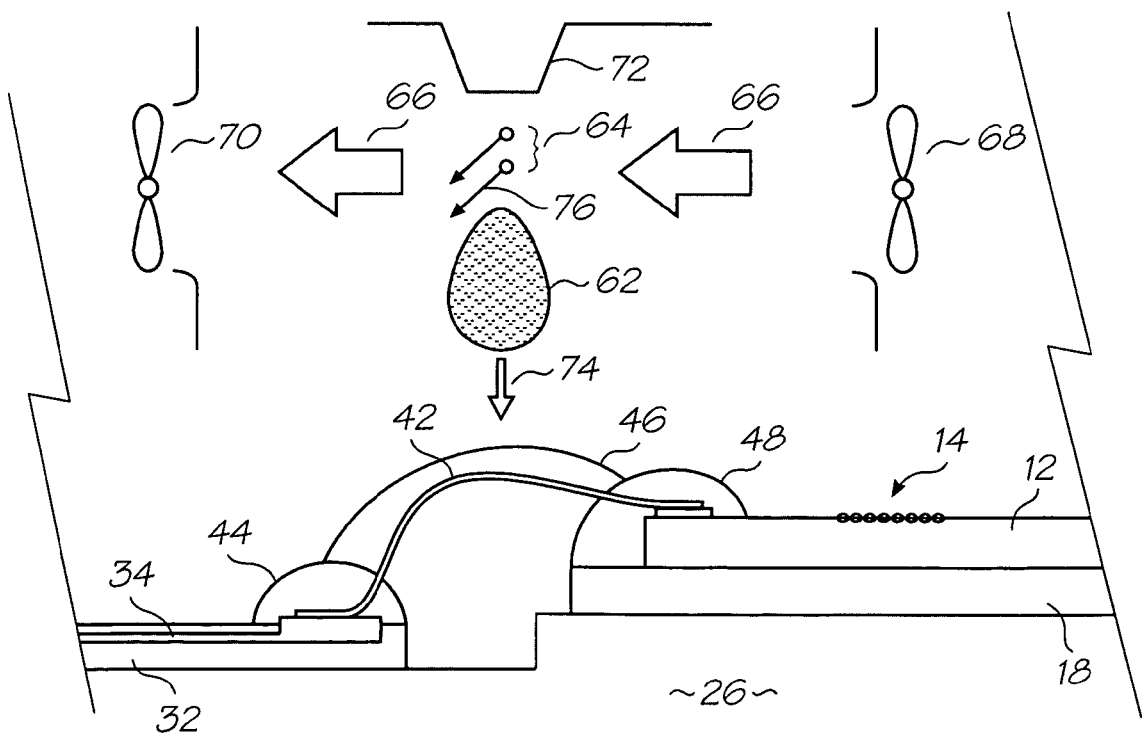
FIG. 9 is a schematic representation of an encapsulant jetter depositing encapsulant onto a wire bond with satellite drop trajectories being controlled by induced air flow.

FIG. 9 shows the technique the Applicant developed for jetting encapsulant on to the wire bonds. As discussed in the Background to the Invention, satellite drops 64 can break away from the primary drops 62 ejected from the jet nozzle 72. Being two or three orders of magnitude smaller than the primary drops 72, the satellite drops 76 are easily deflected from their normal trajectory by any air turbulence, whereas turbulent air has negligible effect on the trajectory 74 of the primary drops 62. The primary drops 62 form the vast bulk of the encapsulant beads 44, 46 and 48 so satellite drops have no detrimental effect on the encapsulation of the wire bonds. However, if the die 12 has an active surface such as a printhead IC, then the satellite drops 64 can be misdirected by turbulence and deposit on functional elements such as a nozzle array 14. Here the satellite drops 64 can have a seriously detrimental effect. In contrast, if the satellite drops 64 fall on the flex PCB 32, there is no effect on the operation of the conductive traces 34.

The Applicant's work has shown that a low velocity gas flow 66 between the jetter nozzle 72 and the wire bonds 42 can provide a controlled the satellite trajectory 76 while having negligible effect on the primary trajectory 74. An air flow 66 with a speed less than 2 m/s directed transverse to the primary drop trajectory 74 will ensure the satellite drops 64 follow a trajectory 76 leading to the flex PCB 32 where they will not cause any harm. The air flow 66 can be provided by generating a positive air pressure (relative to atmospheric) and/or a negative air pressure. For example a fan 68 or an exhaust fan 70 may be used individually or in combination to create the desired gas flow 66. Of course, the gas flow 66 could be any direction that provides a satellite trajectory 76 that avoids the nozzle array 14.

Void Reduction in Encapsulant Beads

Figure 10A:
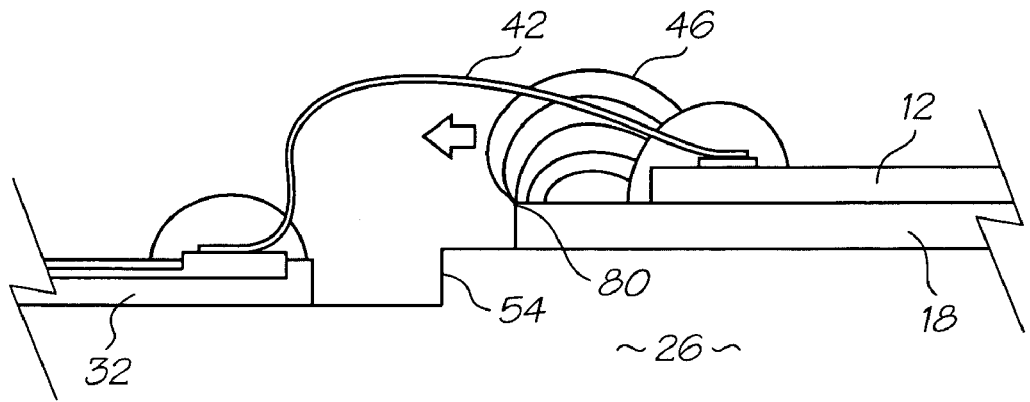
FIGS. 10A to 10C show the progressive growth of a bead of fill encapsulant as it is deposited and the formation of voids within the encapsulant bead.
Figure 10B:
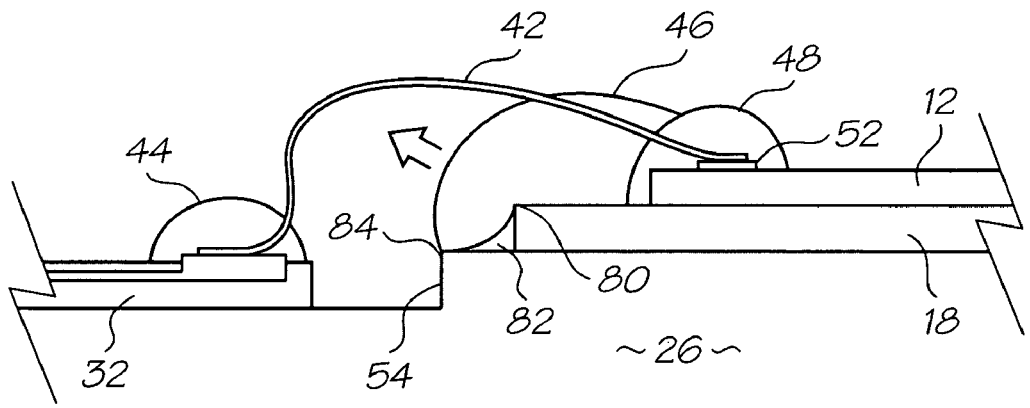
Figure 10C:
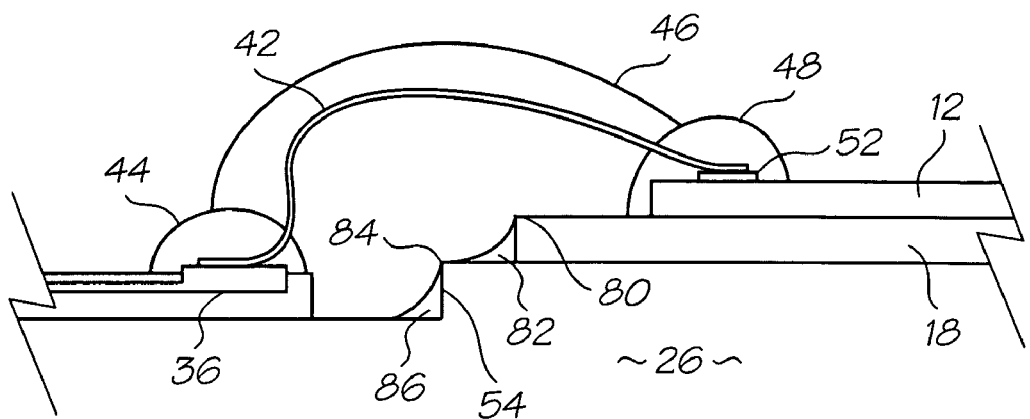

FIGS. 10A, 10B and 10C show progressive stages in the deposition of a bead of fill encapsulant 46. As shown in FIG. 10A, fill encapsulant is deposited along one side of the gap between the die contacts 52 and the PCB contacts 36. The gap is defined by the dam encapsulant bead 48 covering the die contacts and the PCB dam encapsulant bead 44 on the PCB contacts. The surface within the gap is tiered with several hard edges between different levels. For example, the edge of the die, the edge of the die attach film 80 and the edge of the step formation 54. It has been found that when encapsulating a tiered surface such as this, the encapsulant should be deposited on higher levels and allowed to flow into the lower levels. If deposited into the lowest level, the meniscus of the growing bead touches any vertical sides before the encapsulant flow has reached completely into the corner. This leaves a trapped air bubble in a void at the internal corners of the tiered surface.

Unfortunately, allowing the encapsulant to cascade down from upper to lower tiers can also result in voids at the internal corners. The growing bead of encapsulant material 46 can pin its meniscus at the hard edges on the top edge of each tier (e.g. the top edge of the die attach film 18). As shown in FIG. 10B, the meniscus can stay anchored at the hard edge 80 instead of flowing down the vertical side of the die attach edge. Eventually the bulging meniscus sags over the edge that it is pinned to, until it touches the lower tier. Again, this traps an air pocket at the internal corner which forms a void 82.

FIG. 10C shows the completed encapsulant bead 46. Another void 86 has formed at the internal corner 86 of the step formation 54. The air pressure in the voids increases as the temperature of the device increases during operation. The high air pressure can deform the bead 46 or even the entire device, or crack the bead 46 and expose the wire bonds 42.

Figure 11:
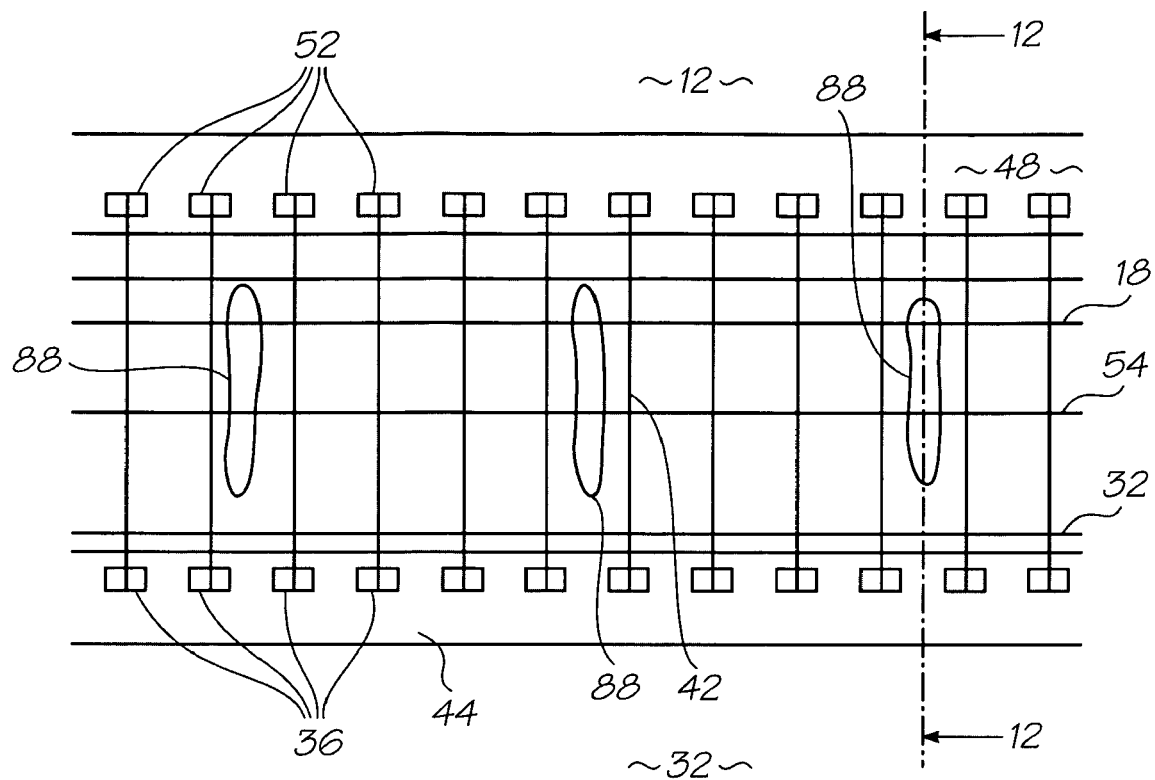
FIG. 11 is a schematic plan view of a series of wire bonds with transverse beads of encapsulant.
Figure 12:
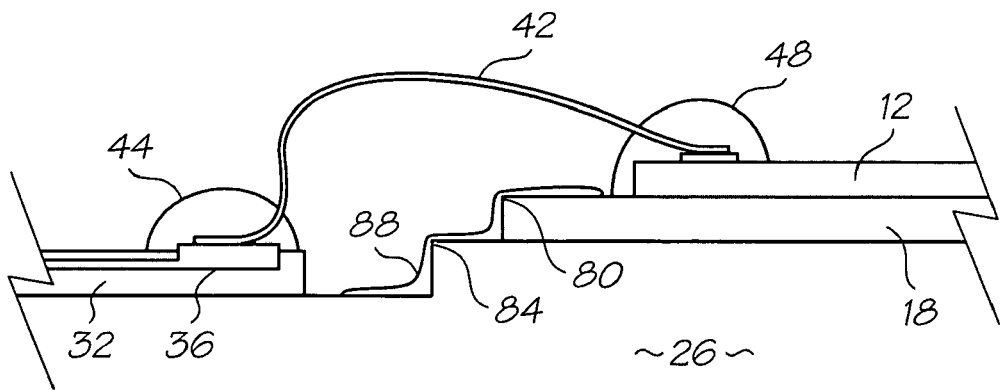
FIG. 12 is a schematic section through line 12-12 shown in FIG. 11.

FIGS. 11 and 12 show the Applicant's solution to this issue. FIG. 11 shows the wire bonds 42 extending across the gap 89 between the die contacts 52 and the PCB contacts 36. Also shown in plan view is the bead of dam encapsulant covering the die contacts 52 and the dam encapsulant 44 covering the PCB contacts 36. Transverse beads 88 of fill encapsulant are deposited in the gap 89 at several points along the series of wire bonds 42. Each of the transverse beads 88 extends from the die attach film 18 to the base of the step formation 54 in the LCP molding 26.

FIG. 12 is a schematic section view through line 12-12 of FIG. 11. The transverse beads 88 flow over the hard edges 80 and 84 in the gap 89. The small transverse beads 88 disrupt the hard edges in the gap such that when the majority of the fill encapsulant bead is deposited, the meniscus does not pin at the edges but flow down to the internal corners and any other constricted spaced within the gap. The encapsulant spreads across the gap much sooner and avoids building up behind a large radius meniscus.

Asymmetrical Wire Bond Arcs

Figure 13:
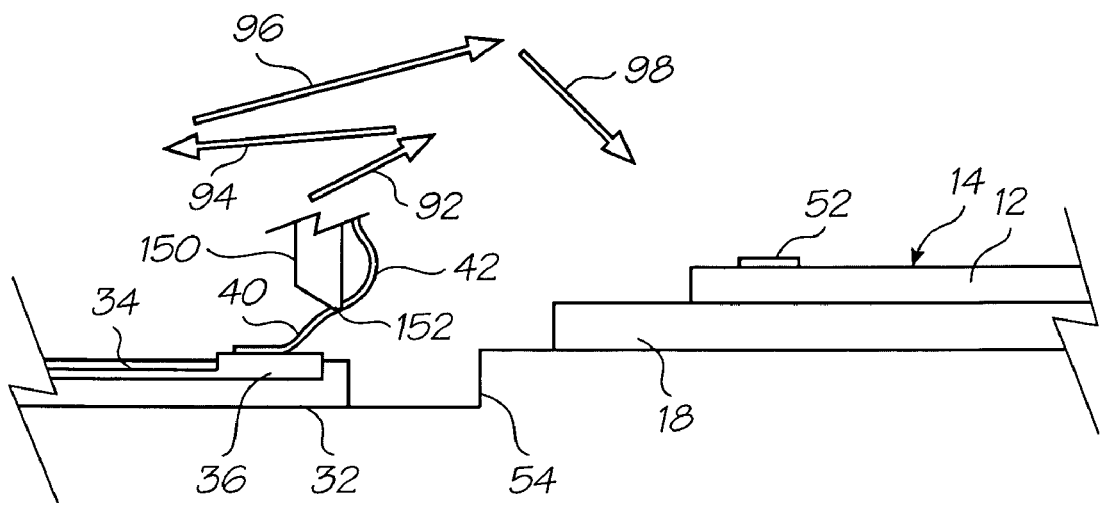
FIG. 13 schematically shows the path of a wedge bonder during the formation of a wire bonder.

FIG. 13 shows the technique used to form a wire bond such that the peak of its arc is skewed away from the die 12 (see for example, the peak of the wire 42 shown in FIG. 12). The wedge bonder 150 ultrasonically welds the end of the wire bond 42 to the PCB contacts 36. The wedge then draws the wire upwardly (at about 45 degrees) and towards the die 12 as indicated by arrow 92. At a predetermined point between the PCB 32 and the die 12, the wedge stop moving towards the die and starts moving away from the die as indicated by arrow 94. This bends the wire 42 back to decrease the radius of curvature at the heel 40. Subsequently, the wedge 150 again moves towards the die 12 as indicated by arrow 96. This allows the radius of the heel 40 to marginally increase as the elastic deformation is relaxed. However, plastic deformation holds the wire bond heel 40 at a reduced radius and this skews the arc formed by the wire bond into an asymmetrical profile with the peak pulled away from the die. Finally, the wire 42 is drawn down to the die contact 52 and ultrasonically welded (see arrow 98). As discussed above, deforming the wire bond 42 in this way reduces its height relative to the active surface and moving the peak further from the die 12 also improves the ability to bring the paper path closer to the nozzles 14.

Asymmetric Deposition of Encapsulant Bead

Figure 14:
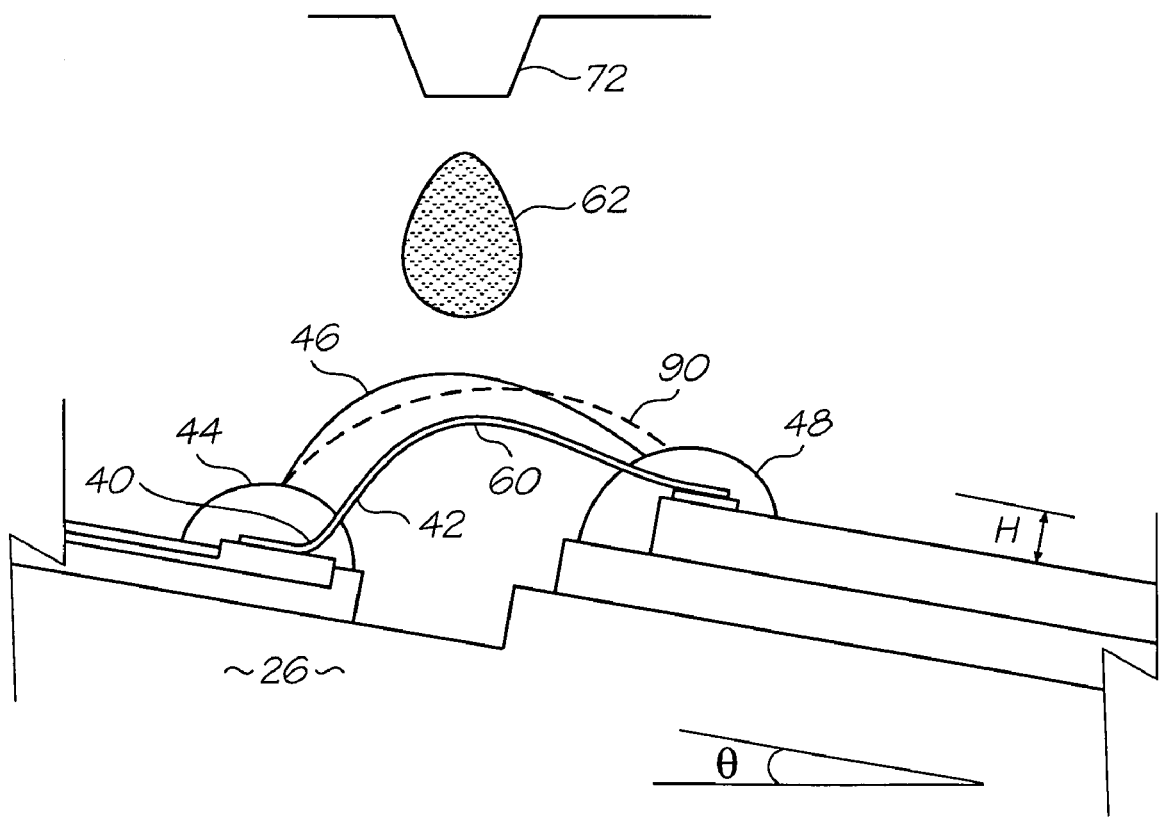
FIG. 14 shows the deposition of encapsulant onto a wire bond while its supporting structure is held inclined to the horizontal; and, FIG. 15 is a schematic representation of a tack adhesion testing device.

Pursuant to forming an asymmetric wire bond arc as shown above, FIG. 14 shows the deposition of an encapsulant bead 46 that is similarly asymmetrical. Encapsulant drops 62 are ejected from a jetter nozzle 72 vertically downwards on to the wire bond 42. The LCP molding 26 is positioned under the jetter nozzle 72 such that the die 12 and in particular, the active surface 14 is in a plane inclined at angle $\theta$ to the horizontal. As the drops of encapsulant collect between the beads of dam encapsulant 44 and 48, the fill bead 46 forms with its peak directly under the nozzle 72. This gives the bead 46 a profile that more closely correspond to the arc of the wire bond 42. If the die 12 were not inclined at angle $\theta$ during encapsulant deposition, the fill bead profile would follow the dotted line 90. The Applicant's work has shown that $\theta$ need only be 10 to 15 degrees for the bead of fill encapsulant to skew away from the die in roughly the same manner as the wire bond.

Encapsulant Tack Testing Device

Figure 15:
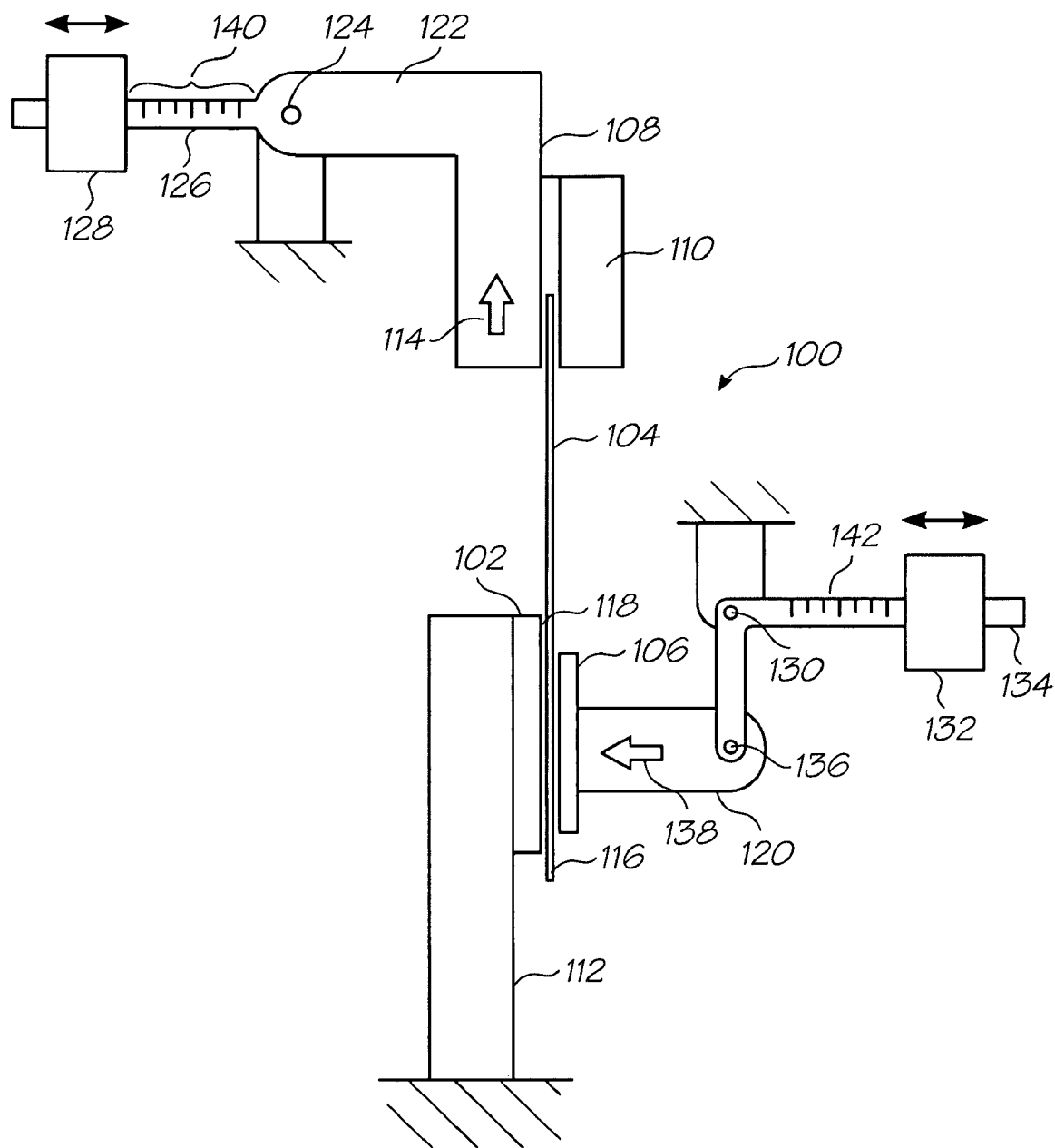

FIG. 15 shows a tack adherence testing device 100. This device quantitatively tests the tack adhesion of various materials such as encapsulant bead epoxy. This provides a more useful assessment of the encapsulant than the qualitative term previously used in this field, such as a perceived tack when touched with a bare finger. Such tack adhesion observations are completely subjective and completely inadequate for any rigorous analysis of materials used in a paper feed path. Ordinary workers will readily appreciate that tack adhesion can be at the root of problems such as paper cockle and other feed jams. In contrast, precise qualitative measures of tack adhesion provide accurate and meaningful production specifications.

The tack adhesion testing device 100 quantitatively measures tack adhesion between a material such as a encapsulant 102 and an object such as a sheet of paper 104 with a planar surface 116 for contact with the encapsulant 102. A material mount 112 mounts a quantity of the encapsulant 106 such that it presents an exposed flat face 118. An object mount 108 securely holds the paper 104 with a clamp 110. The planar surface 116 is in flat contact with the exposed flat surface 118.

The object mount 108 is attached to lift arm 122. Lift arm 122 is pivotally mounted to raise the object mount 108 relative to the material mount 102. A slidable weight 128 can be moved along the lever arm 126 such that the lift force 114 on the object mount 108 is adjustable.

A contact force applicator 106 is configured for applying a known force 138 to the exposed flat face 118. Pivot arm 120 is hinged to the contact force lever arm 134 which in turn pivots about fulcrum 130. A contact force weight 132 slides along the lever arm 134 to vary the contact force between the object 104 and the material 102.

The lift arm 122, pivot 124, lever arm 126 and sliding weight 128 act as a separation mechanism for applying a variable lift force 114 to the material mount 108. Gradations 140 marked on the lever arm 126 provide an indicator for recording the force at which the flat face 118 and the planar surface 116 slide relative to each other. Similar gradations 142 along the contact lever arm 134 indicate the contact force 138.

The paper sheet 104 is clamped such that the lift force 114 is applied in the plane of contact between the flat face 118 and the planar surface 116. This stops the lift force from contributing to the contact force 138. Likewise, the contact force application applicator 106 applies the contact force 138 in a direction normal to the flat face 118 and the planar surface 116 so as not to affect the magnitude of the lift force 114.

The invention has been described herein by way of example only. The ordinary will readily recognize many variations and modifications which do not depart from the spirit and scope of the broad inventive concept.

The invention claimed is:

1. An electronic component comprising:
a support structure with a plurality of electrical conductors;
a series of wire bonds, each of the wire bonds extending from one of the electrical conductors respectively, each of the wire bonds having an end section contacting the electrical conductor and an intermediate section contiguous with the end section;
a bead of dam encapsulant encapsulating the electrical conductors and the end section of each of the wire bonds;
a bead of fill encapsulant contacting the bead of dam encapsulant and encapsulating the intermediate portion of each of the wire bonds; wherein,
the dam encapsulant has a higher modulus of elasticity than the fill encapsulant.

2. An electronic component according to claim 1 wherein the support structure comprises a printed circuit board (PCB) and the electrical conductors are PCB contacts connected to conductive traces on the PCB.

3. An electronic component according to claim 2 further comprising a die mounted to a chip mounting area on the support structure, the die having a back surface in contact with the chip mounting area and an active surface opposing the back surface, the active surface having electrical contact pads; such that,
the wire bonds electrically connect the PCB contacts and the electrical contact pads on the die; wherein,
a second bead of dam encapsulant is contiguous with the bead of fill encapsulant and encapsulates the electrical contact pads.

4. An electronic component according to claim 3 wherein the dam encapsulant has an elastic modulus between 1 GPa and 3 GPa when cured and the fill encapsulant has an elastic modulus between 10 MPa and 500 MPa when cured.

5. An electronic component according to claim 3 wherein the support structure has a PCB mounting area and the support structure is configured such that the chip mounting area is raised relative to the PCB.

6. An electronic component according to claim 5 wherein the chip mounting area is raised more than 100 microns relative to the PCB contacts.

7. An electronic component according to claim 5 wherein the support structure comprises a liquid crystal polymer (LCP) molding.

8. An electronic component according to claim 5 wherein the encapsulant is an epoxy material with a viscosity greater than 700 cp when uncured.

9. An electronic component according to claim 3 wherein the support structure has a step between the chip mounting area and the conductor mounting area.

10. An electronic component according to claim 3 wherein the support structure comprises an adhesive die attach film which provides the chip mounting area.

11. An electronic component according to claim 3 wherein the PCB is a flexible printed circuit board (flex PCB) and the PCB contacts are a line of bond pads along an edge closest to the die, the bond pads being more than 2 mm from the contacts pads on the die.

12. An electronic component according to claim 3 wherein the intermediate section of each wire bond forms an arc between the PCB contacts and the contact pads on the die, the end section of each of the wire bonds as a curved heel that connects the intermediate section to a foot segment that is welded to the PCB contact, and the second end section having a corresponding heel to connect the intermediate section to a foot segment welded to the contact pads on the die, the curved heel at the PCB contacts having a smaller radius of curvature than the corresponding heel at the contact pads of the die such that the arc of the intermediate section has a peak skewed towards the PCB.

13. An electronic component according to claim 3 wherein the active surface has functional elements spaced less than 260 microns from the contacts pads of the die. In a particularly preferred form, the die is an inkjet printhead IC and the functional elements are nozzles through which ink is ejected.

14. An electronic component according to claim 3 wherein the bead of encapsulant extends less than 200 microns above the active surface of the die.

15. An electronic component according to claim 3 wherein the bead of encapsulant extends less than 100 microns above the active surface.

16. An electronic component according to claim 3 wherein the die is a printhead IC and the active surface is an array of ink nozzles, and the support structure of configured for mounting in a printer such that during use the ink nozzles are less than 200 microns from the paper path.

17. An electronic component according to claim 1 wherein the wire bonds are formed from wire with a diameter less than 40 microns and extend less than 100 microns above the active surface of the die.

18. An electronic component according to claim 1 wherein the encapsulant is an epoxy material that is thixotropic when uncured.

* * * * *